(12) United States Patent
Jhaveri

(10) Patent No.: US 7,969,199 B1
(45) Date of Patent: Jun. 28, 2011

(54) PATTERN CONTROLLED IC LAYOUT

(75) Inventor: Tejas Jhaveri, Pittsburgh, PA (US)

(73) Assignee: PDF Solutions, Inc., San Jose, CA (US)

( * ) Notice: Subject to any disclaimer, the term of this patent is extended or adjusted under 35 U.S.C. 154(b) by 0 days.

(21) Appl. No.: 12/844,568

(22) Filed: Jul. 27, 2010

Related U.S. Application Data

(60) Provisional application No. 61/333,039, filed on May 10, 2010.

(51) Int. Cl.
*H03K 19/00* (2006.01)
(52) U.S. Cl. .......................... 326/101; 326/104; 257/206
(58) Field of Classification Search .................. 326/101, 326/104; 257/202, 204, 206, 208, 211
See application file for complete search history.

(56) References Cited

U.S. PATENT DOCUMENTS

| | | | |
|---|---|---|---|
| 5,796,129 A * | 8/1998 | Mizuno | 257/206 |
| 7,446,352 B2 | 11/2008 | Becker | |
| 7,465,973 B2 | 12/2008 | Chang | |
| 7,627,849 B1 | 12/2009 | Gupta | |
| 7,667,254 B2 * | 2/2010 | Yamamoto | 257/299 |
| 7,676,772 B1 | 3/2010 | Nakagawa | |
| 7,743,349 B2 | 6/2010 | Gupta | |
| 7,745,239 B1 | 6/2010 | Nakagawa | |
| 7,763,534 B2 | 7/2010 | Smayling | |
| 7,888,705 B2 * | 2/2011 | Becker et al. | 257/202 |
| 2008/0137051 A1 | 6/2008 | Maly | |
| 2010/0001321 A1 | 1/2010 | Becker | |
| 2010/0006897 A1 | 1/2010 | Becker | |
| 2010/0006898 A1 | 1/2010 | Becker | |
| 2010/0006899 A1 | 1/2010 | Becker | |
| 2010/0006900 A1 | 1/2010 | Becker | |
| 2010/0006901 A1 | 1/2010 | Becker | |
| 2010/0006902 A1 | 1/2010 | Becker | |
| 2010/0006903 A1 | 1/2010 | Becker | |
| 2010/0006947 A1 | 1/2010 | Becker | |
| 2010/0006948 A1 | 1/2010 | Becker | |
| 2010/0006950 A1 | 1/2010 | Becker | |
| 2010/0006951 A1 | 1/2010 | Becker | |
| 2010/0006986 A1 | 1/2010 | Becker | |
| 2010/0011327 A1 | 1/2010 | Becker | |
| 2010/0011328 A1 | 1/2010 | Becker | |
| 2010/0011329 A1 | 1/2010 | Becker | |
| 2010/0011330 A1 | 1/2010 | Becker | |
| 2010/0011331 A1 | 1/2010 | Becker | |
| 2010/0011332 A1 | 1/2010 | Becker | |
| 2010/0011333 A1 | 1/2010 | Becker | |

(Continued)

OTHER PUBLICATIONS

T. Jhaveri, "Regular Design Fabrics for Low Cost Scaling of Integrated Circuits," Ph.D. Thesis, Carnegie-Mellon University (2010).

(Continued)

*Primary Examiner* — James Cho
(74) *Attorney, Agent, or Firm* — David Garrod

(57) ABSTRACT

The invention provides a reduced complexity layout style based on applying a limited set of changes to an underlying repeated base template. With the templates properly defined in accordance with the characteristic features disclosed, the invention enables efficient implementation of logic circuitry, with a dramatic reduction in the pattern complexity (or number of unique layout patterns at each mask level) for realistically sized designs. This reduction in pattern complexity that the invention provides is particularly important for advanced and emerging semiconductor processes, because it enables effective use of SMO and full-chip mask optimization.

17 Claims, 41 Drawing Sheets

U.S. PATENT DOCUMENTS

| | | |
|---|---|---|
| 2010/0012981 A1 | 1/2010 | Becker |
| 2010/0012982 A1 | 1/2010 | Becker |
| 2010/0012983 A1 | 1/2010 | Becker |
| 2010/0012984 A1 | 1/2010 | Becker |
| 2010/0012985 A1 | 1/2010 | Becker |
| 2010/0012986 A1 | 1/2010 | Becker |
| 2010/0017766 A1 | 1/2010 | Becker |
| 2010/0017767 A1 | 1/2010 | Becker |
| 2010/0017768 A1 | 1/2010 | Becker |
| 2010/0017769 A1 | 1/2010 | Becker |
| 2010/0017770 A1 | 1/2010 | Becker |
| 2010/0017771 A1 | 1/2010 | Becker |
| 2010/0017772 A1 | 1/2010 | Becker |
| 2010/0019280 A1 | 1/2010 | Becker |
| 2010/0019281 A1 | 1/2010 | Becker |
| 2010/0019282 A1 | 1/2010 | Becker |
| 2010/0019283 A1 | 1/2010 | Becker |
| 2010/0019284 A1 | 1/2010 | Becker |
| 2010/0019285 A1 | 1/2010 | Becker |
| 2010/0019286 A1 | 1/2010 | Becker |
| 2010/0019287 A1 | 1/2010 | Becker |
| 2010/0019288 A1 | 1/2010 | Becker |
| 2010/0023906 A1 | 1/2010 | Becker |
| 2010/0023907 A1 | 1/2010 | Becker |
| 2010/0023908 A1 | 1/2010 | Becker |
| 2010/0023911 A1 | 1/2010 | Becker |
| 2010/0025731 A1 | 2/2010 | Becker |
| 2010/0025732 A1 | 2/2010 | Becker |
| 2010/0025733 A1 | 2/2010 | Becker |
| 2010/0025734 A1 | 2/2010 | Becker |
| 2010/0025735 A1 | 2/2010 | Becker |
| 2010/0025736 A1 | 2/2010 | Becker |
| 2010/0032721 A1 | 2/2010 | Becker |
| 2010/0032722 A1 | 2/2010 | Becker |
| 2010/0032723 A1 | 2/2010 | Becker |
| 2010/0032724 A1 | 2/2010 | Becker |
| 2010/0032726 A1 | 2/2010 | Becker |
| 2010/0037194 A1 | 2/2010 | Becker |
| 2010/0037195 A1 | 2/2010 | Becker |
| 2010/0096671 A1 | 4/2010 | Becker |
| 2010/0187615 A1 | 7/2010 | Becker |
| 2010/0187616 A1 | 7/2010 | Becker |
| 2010/0187617 A1 | 7/2010 | Becker |
| 2010/0187618 A1 | 7/2010 | Becker |
| 2010/0187619 A1 | 7/2010 | Becker |
| 2010/0187620 A1 | 7/2010 | Becker |
| 2010/0187621 A1 | 7/2010 | Becker |
| 2010/0187622 A1 | 7/2010 | Becker |
| 2010/0187623 A1 | 7/2010 | Becker |
| 2010/0187624 A1 | 7/2010 | Becker |
| 2010/0187625 A1 | 7/2010 | Becker |
| 2010/0187626 A1 | 7/2010 | Becker |
| 2010/0187627 A1 | 7/2010 | Becker |
| 2010/0187628 A1 | 7/2010 | Becker |
| 2010/0187630 A1 | 7/2010 | Becker |
| 2010/0187631 A1 | 7/2010 | Becker |
| 2010/0187632 A1 | 7/2010 | Becker |
| 2010/0187633 A1 | 7/2010 | Becker |
| 2010/0187634 A1 | 7/2010 | Becker |

OTHER PUBLICATIONS

T. Jhaveri, "Improvements in Integrated Circuit Patterning Through Extreme Layout Regularity," M.S.E.E. Thesis, Carnegie-Mellon University (2007).

L. Leibmann, et al., "Simplify to Survive, prescriptive layouts ensure profitable scaling to 32nm and beyond," Proc. SPIE, vol. 7275, 72750A (2009).

T. Jhaveri, et al., "Layout Pattern Minimization for Next-Generation Technologies," Proc. SPIE, vol. 7641 (2010).

T. Jhaveri, et al., "OPC Simplification and Mask Cost Reduction Using Regular Design Fabrics," Proc. of SPIE vol. 7274 (2009).

R. Socha, et al., "Design Compliant Source Mask Optimization (SMO)," Proc. of SPIE vol. 7748 (2010).

L. Liebmann, et a., "Demonstrating the Benefits of Template-based Design-technology Co-optimization," Proc. of SPIE, vol. 7641 (2010).

T. Jhaveri, et al., "Economic Assessment of Lithography Strategies for the 22nm Technology Node," Proc. of SPIE, vol. 7488 (2009).

T. Jhaveri, et al., "Maximization of layout printability/manufacturability by extreme layout regularity," J. Micro/Nanolith. MEMS MOEMS 6(3), Jul.-Sep. 2007.

T. Jhaveri, et al., "Enabling Technology Scaling with 'In Production' Lithography Processes," Proceedings of the SPIE, vol. 6924 (2008).

B. Taylor, "Automated Layout of Regular Fabric Bricks," M.S. Thesis, Carnegie-Mellon University (2005).

* cited by examiner

PATTERN CONTROLLED IC LAYOUT

CROSS-REFERENCE TO RELATED APPLICATION

This application claims priority from U.S. Provisional Application Ser. No. 61/333,039, filed May 10, 2010, entitled "Pattern Controlled IC Layout" and naming the inventor herein, which provisional application is hereby incorporated by reference herein.

FIELD OF THE INVENTION

This invention relates generally to the design and layout of logic circuits using simplified geometrical primitives. More specifically, the invention teaches a simplified layout style that provides excellent layout density, yet dramatically reduces the number of unique "neighborhood patterns" for large designs. [For any given layer (e.g., M1, poly, etc), a "neighborhood pattern" is the set of geometrical features in the same layer that appear within a predetermined interaction distance of a given vertex. Neighborhood patterns are preferably characterized or classified at each vertex in a given layer.]

BACKGROUND

Advanced and emerging IC processes (e.g., 28 nm, 22 nm, etc.) cannot reliably print arbitrary geometric patterns because of complex interactions between neighboring features during the patterning processes. This problem is well known, and attempts to solve it have included the use of restricted design rules, gridded and/or unidirectional layout styles, etc.

Known techniques, however, do not effectively address the challenges posed by the most advanced (e.g., 22 nm and below) IC processes. In these processes, the pattern interaction distance (the maximum distance over which one geometric feature can affect the other neighboring features) is so large relative to the size of the smallest printable features that use of source-mask optimization (SMO) becomes highly desirable. But SMO is very computationally burdensome and, as a result, can only be practically employed on layouts of about 100 μm×100 μm.

Moreover, for SMO to be effective, the optimized area should adequately represent the complete (or nearly complete) universe of neighborhood patterns that appear on the chip. But traditional layout techniques (RDR, gridded, etc.) cannot achieve this goal—at least without significant sacrifices in layout density.

THE INVENTION

In its preferred form, layouts according to the invention are made from small deviations to an underlying fabric.
Aspects of the invention include:
  Defining an appropriate underlying regular, repeating construct, which is our base fabric; and
  Defining locations and type of deviations allowed to this fabric to create required circuit components.
In one of its preferred forms, the invention includes:
  Determining the appropriate underlying fabric (baseTemplate);
  Determining the appropriate set of deviations (connectorTemplates); and
  Defining usable circuits that be mapped onto the fabric (cellTemplates).

These inventive teachings enable cell layouts that are area competitive with conventional design practices, yet have significantly reduced pattern counts. Layouts created using the inventive methodology can be used for deterministic SMO—i.e., one can ensure that process optimization techniques such as SMO will converge.

DESCRIPTION OF THE FIGURES

[Definitional note: As referenced in the description and the claims, the terms "first metal layer," "metal-1," and "m1" are all intended to refer to the lowest layer of metallization, regardless of what that layer might be called in a given process (for example, in some processes, the "contact" layer is effectively used as a first metal layer for local interconnect). Similarly, "second metal layer," "metal-2," and "m2" shall all refer to the second-lowest layer of metallization in the process.]

FIRST ILLUSTRATIVE EMBODIMENT

Unidirectional m2

FIGS. 15A-H

Figure 1:
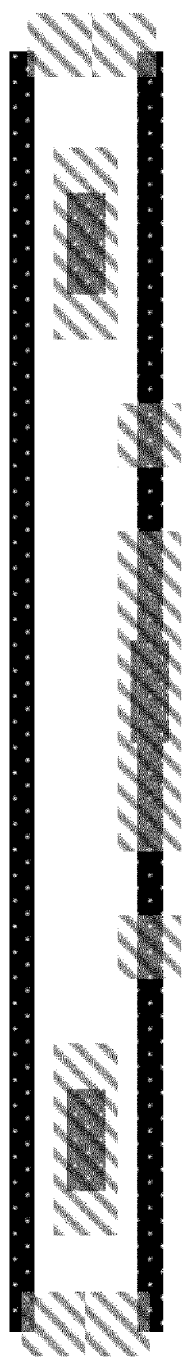
FIG. 1 shows an exemplary baseTemplate (for a 10 track library with unidirectional m2). Other baseTemplates can be defined for any particular cell height. A single design can use different base templates, depending on height of the cells and functions to be implemented. All cells are preferably created by first instantiating the baseTemplate. The baseTemplate is generally defined by the minimum poly-to-poly pitch, but certain baseTemplates (e.g., taps and other analog cells) can omit poly. A baseTemplate can include metal 2 pieces, contacts and vias, just like metal 1 and poly segments
Figure 2:
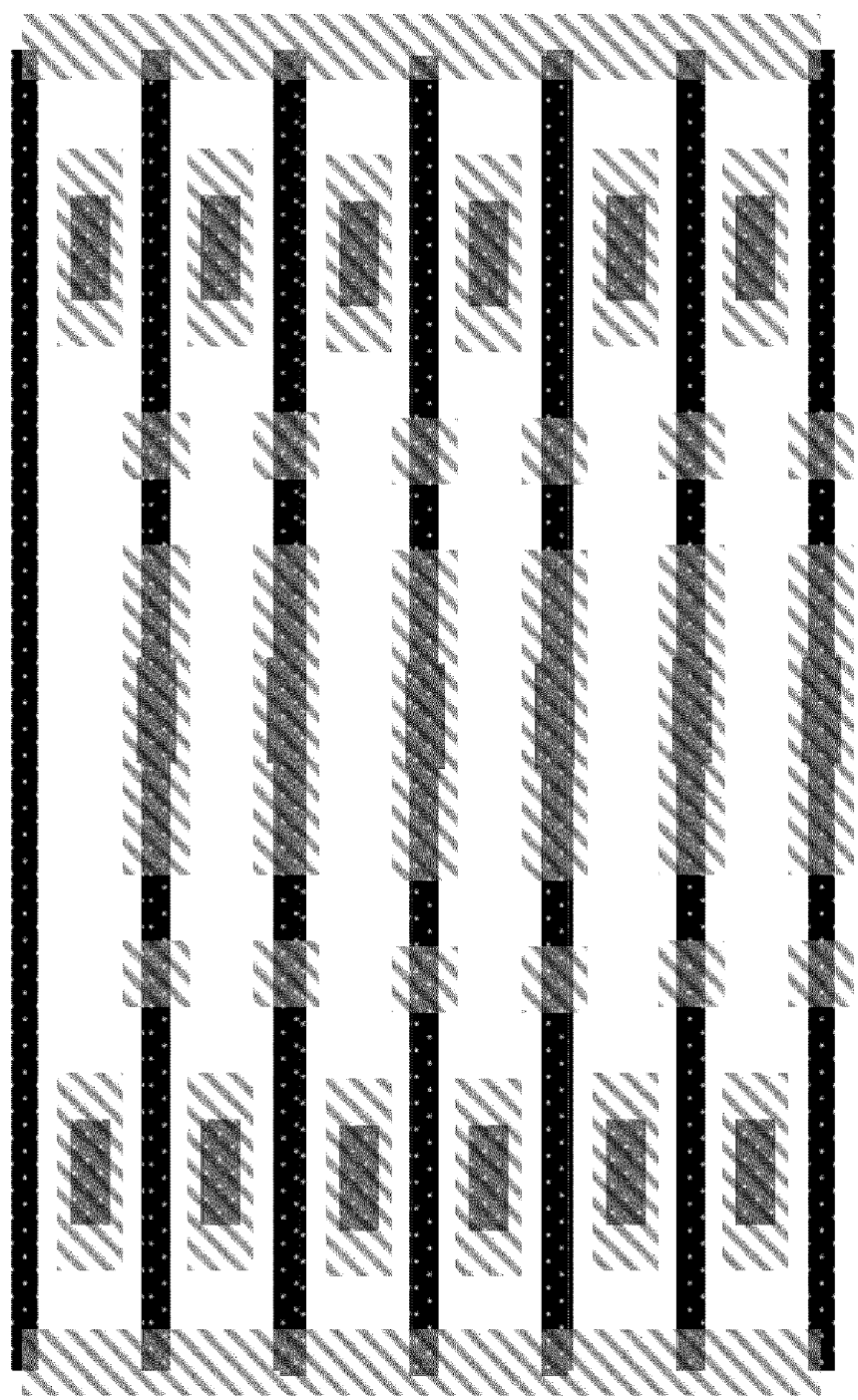
FIG. 2 shows a collection of abutted baseTemplates of the design depicted in FIG. 1. As depicted, the baseTemplates abut widthwise at the minimum poly-to-poly pitch.
Figure 3A:
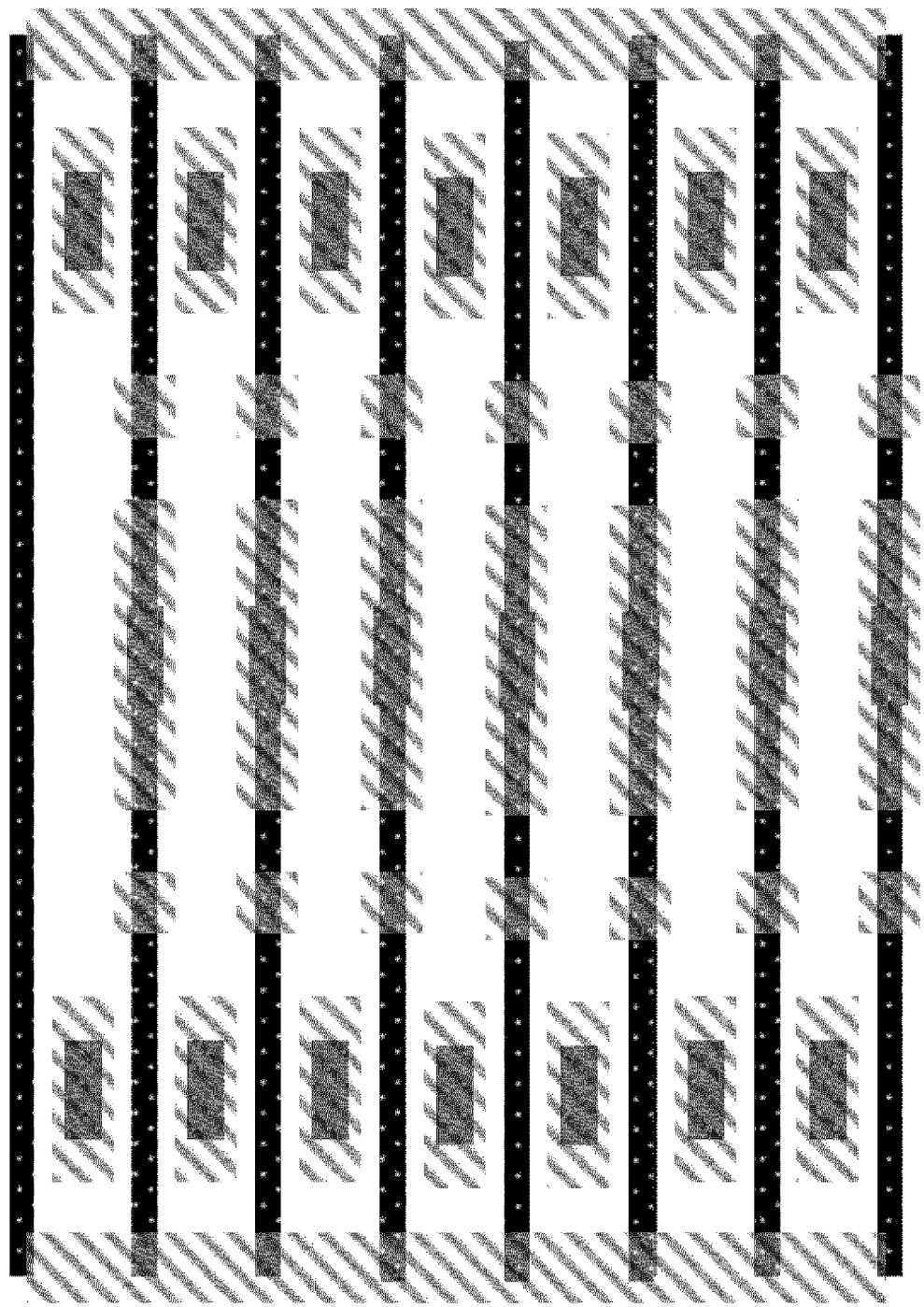
FIG. 3A shows a collection of abutted base templates.
Figure 3B:
FIG. 3B shows a collection of instantiated connector templates. ConnectorTemplates are added onto the array of baseTemplates to form a logic circuit or cellTemplate. Different types of connectorTemplates are used at different locations in the array layout. The inventive approach—based on a single baseTemplate and a limited number of connectorTempaltes—lends itself well to automated and/or automatically optimized layout methods for the cells.
Figure 4:
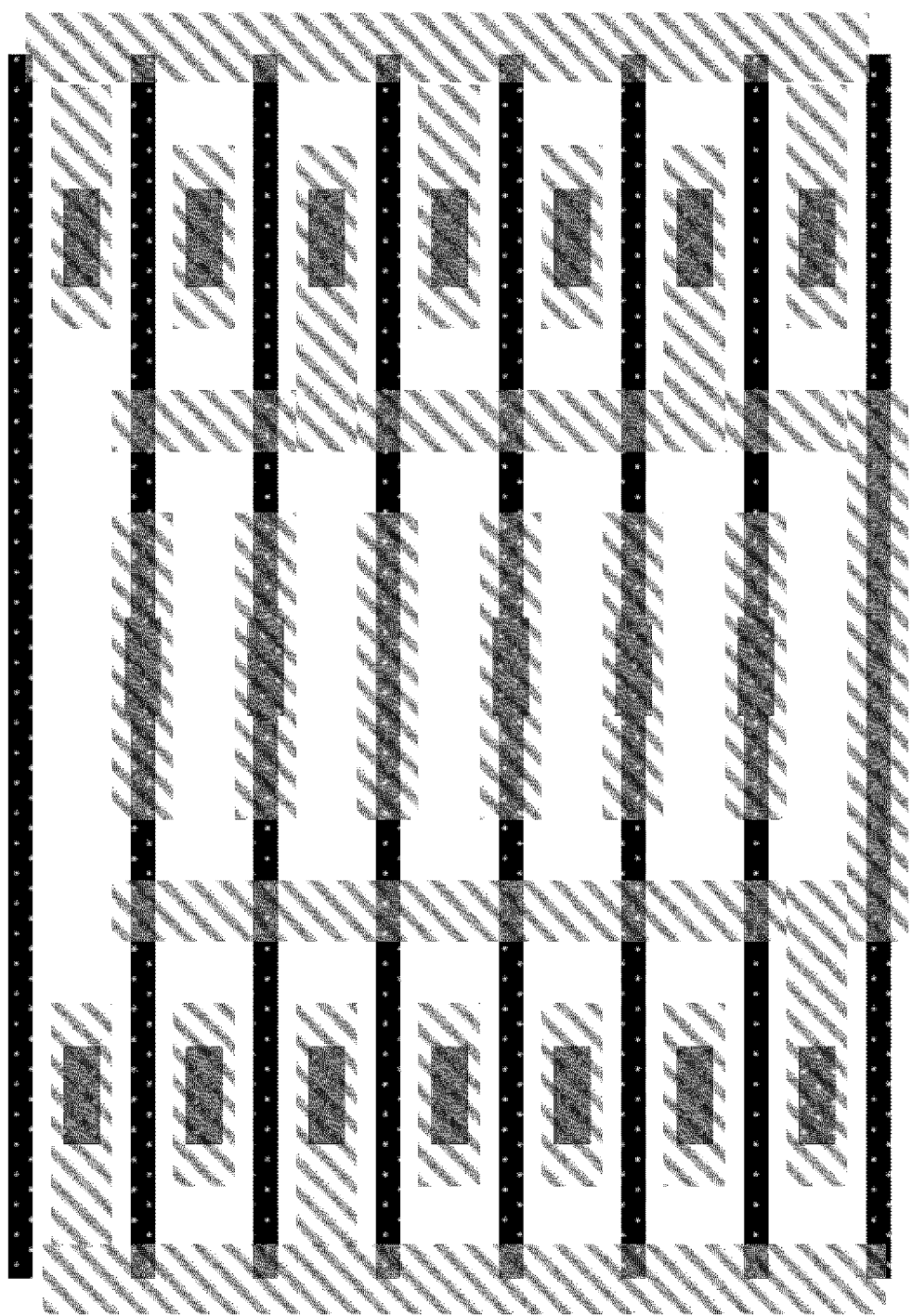
FIG. 4 shows how the base templates of FIG. 3A and the instantiated connector templates of FIG. 3B are ANDed to form the cell shown in FIG. 4.
Figure 5:
FIG. 5 depicts the different types of connectorTemplates for an exemplary embodiment of the invention. Increasing the number of connectorTemplate types leads to exponential growth of patterns due to possible combinations. Generally, the invention strives to reduce the number of connectorTemplate types, but can allow special connectors in specific cells if needed. (As long as it is in a controlled environment.) For the depicted example, each baseTemplate has only 5 possible locations for metal 1 connectorTemplates and 4 types of connectorTemplates. Three locations only allow 1 type of connectorTemplate to be used; two locations allow 4 types of connectorTemplates to be used.
Figure 6A:
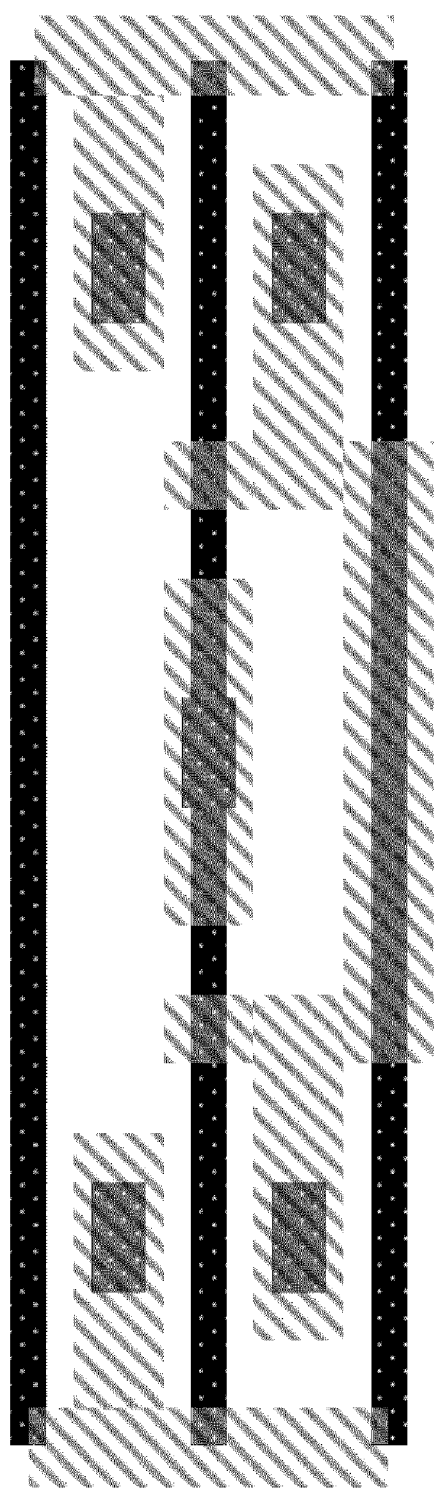
FIG. 6A depicts an exemplary inverter cell formed from the base and connector templates of FIGS. 1 and 5.
Figure 6B:
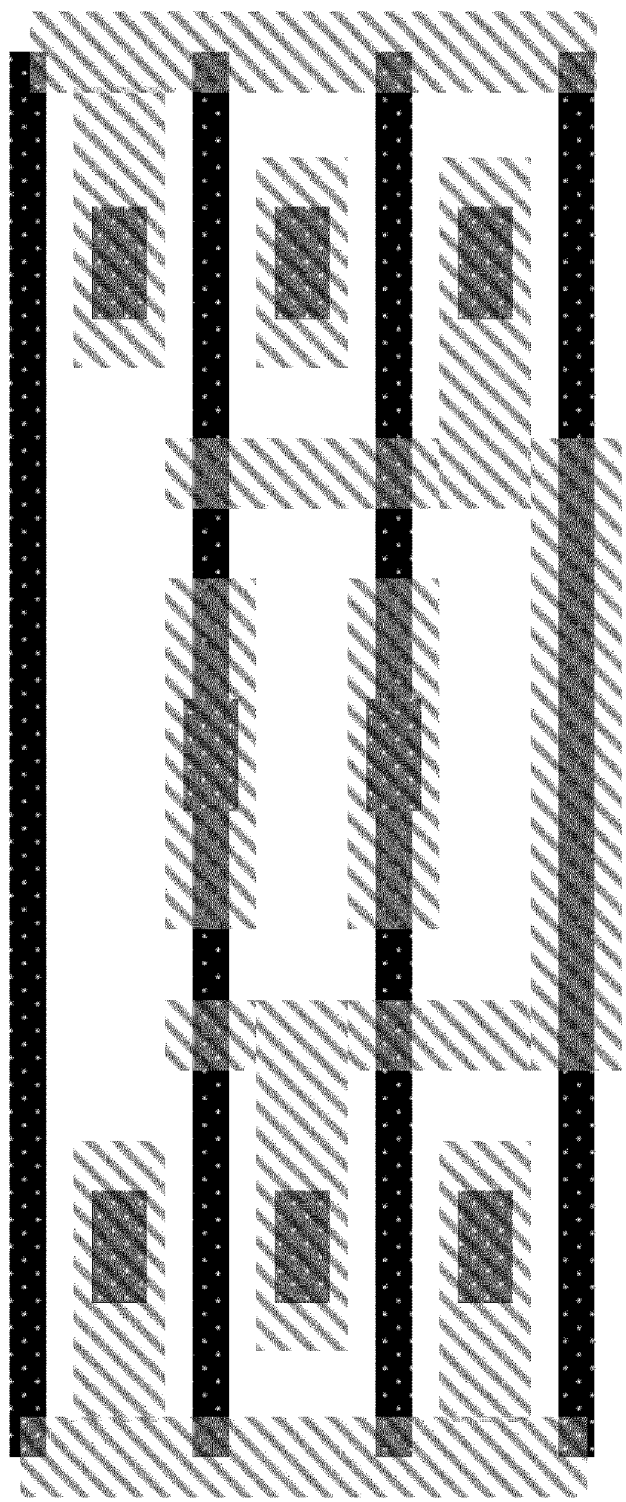
FIG. 6B depicts an exemplary nor2 cell formed from the base and connector templates of FIGS. 1 and 5.
Figure 6C:
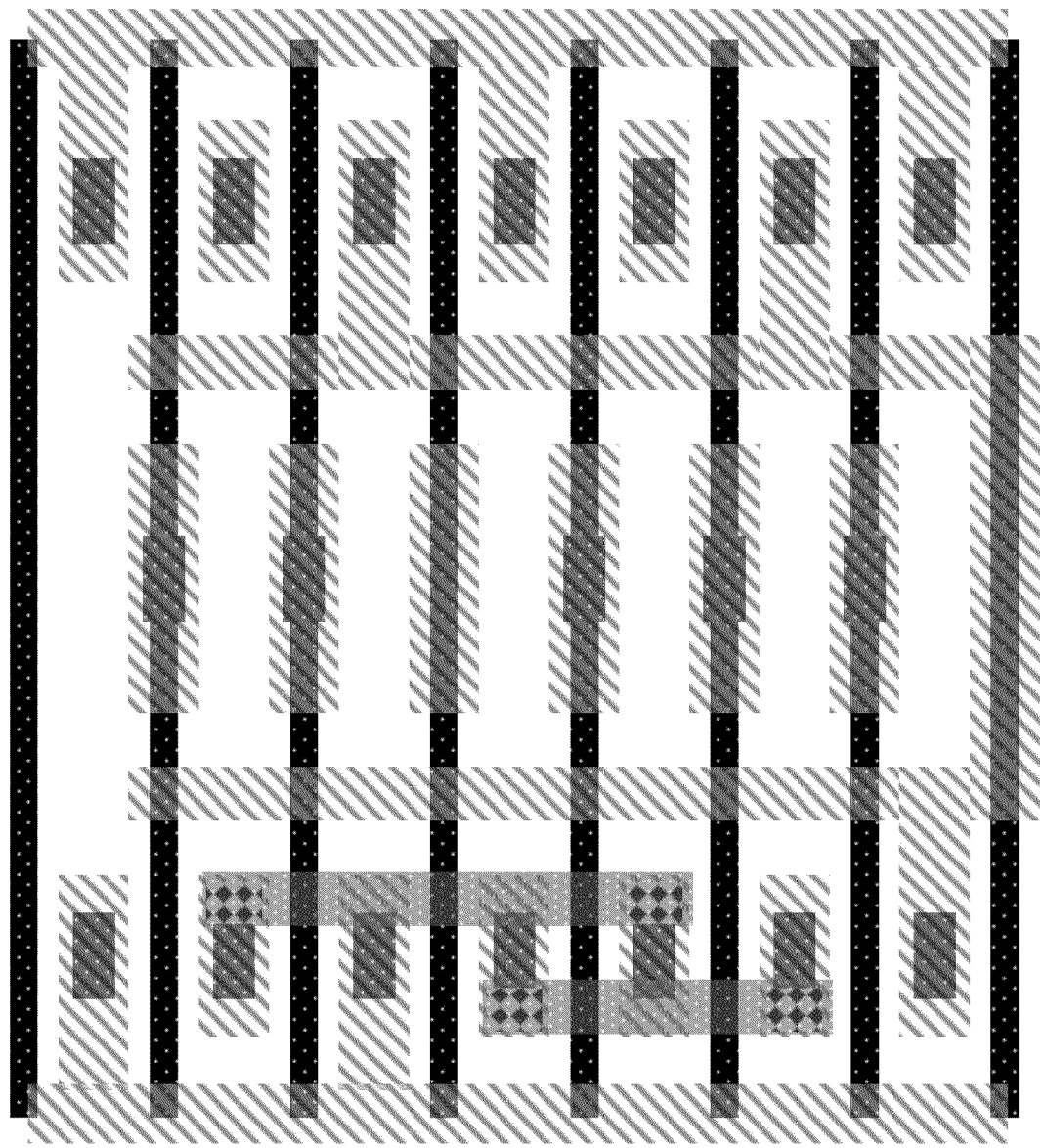
FIG. 6C depicts an exemplary or22ao22nand2 cell formed from the base and connector templates of FIGS. 1 and 5. The layouts of FIGS. 6A-C represent no area penalty, as compared to conventional, non-pattern controlled approaches.
Figure 7:
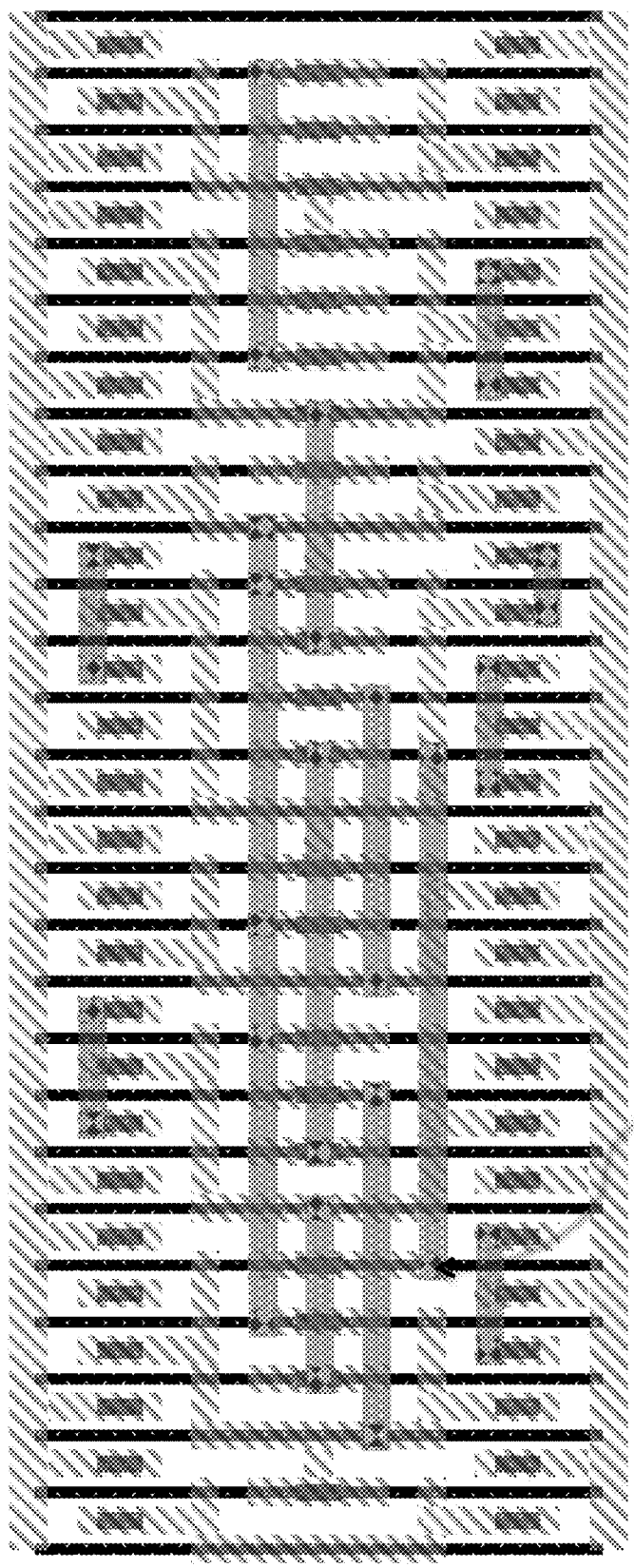
FIG. 7 depicts an exemplary flip-flop with scan and reset cell formed from the base and connector templates of FIGS. 1 and 5, along with one special connector template.
Figure 8A:
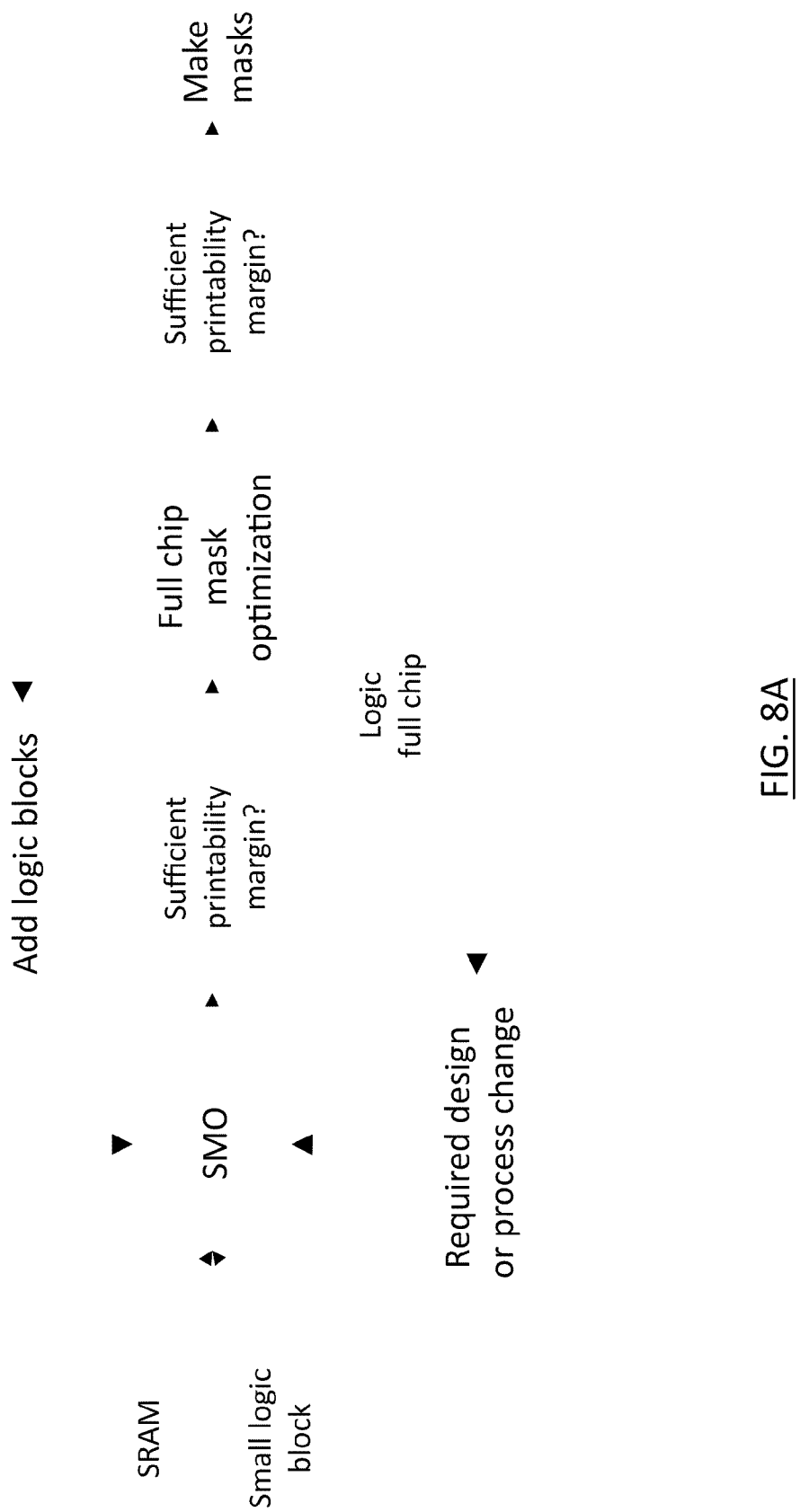
FIG. 8A depicts a typical SMO/OPC flow in accordance with prior-art layout techniques. As depicted, an initial collection of SRAM and logic cells is subjected to SMO. This process may be repeated—with adjustments—until the SMO process indicates a sufficient printability margin for the SRAM/logic cell collection. Next, the entire chip is rendered and subjected to full-chip mask optimization (i.e., OPC). If the OPC process produces a sufficient printability margin, the process ends in success. But with conventional layout techniques, the full-chip pattern count is substantially higher than that in the SMO-optimized sample. Thus, there is no assurance that the full-chip OPC process will produce a printable mask. Consequently, the prior-art process may require additional SMO cycles (as depicted by the "Add logic blocks" step). Moreover, even with the additional SMO cycles, there is no assurance that this process ever converges to a printable, full-chip mask.
Figure 8B:
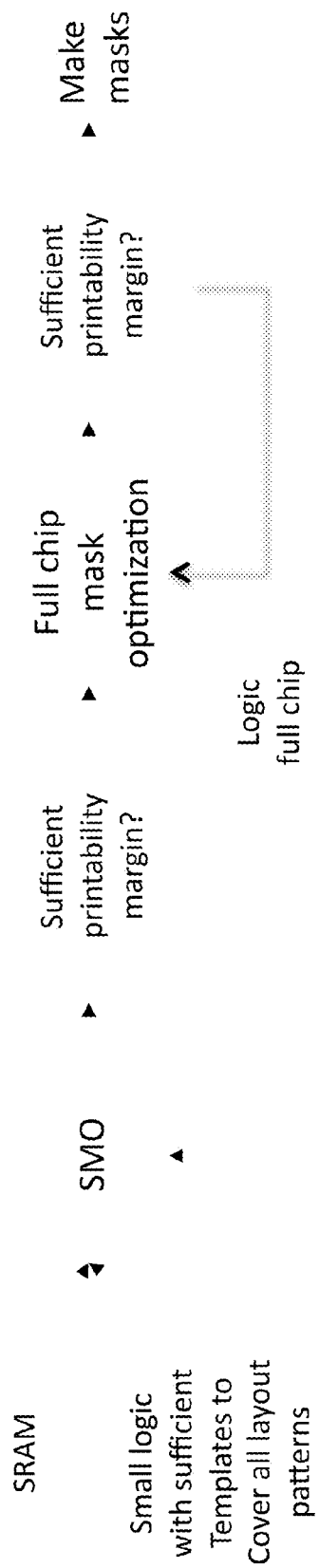
FIG. 8B exemplifies an improved SMO/OPC flow enabled by the reduced pattern complexity that the invention provides. This flow commences similarly to that of FIG. 8A, but rather than using an arbitrary collection of logic cells, the inventive flow selects as input to the SMO process a set of base/connector templates that includes all or substantially all possible layout patterns within the selected set. This means that when these same patterns are used to render full-chip logic, the total pattern count does not substantially increase. This greatly reduces (if not eliminates) the possibility of needing to redo the SMO cycle in order to achieve OPC convergence.
Figure 9:
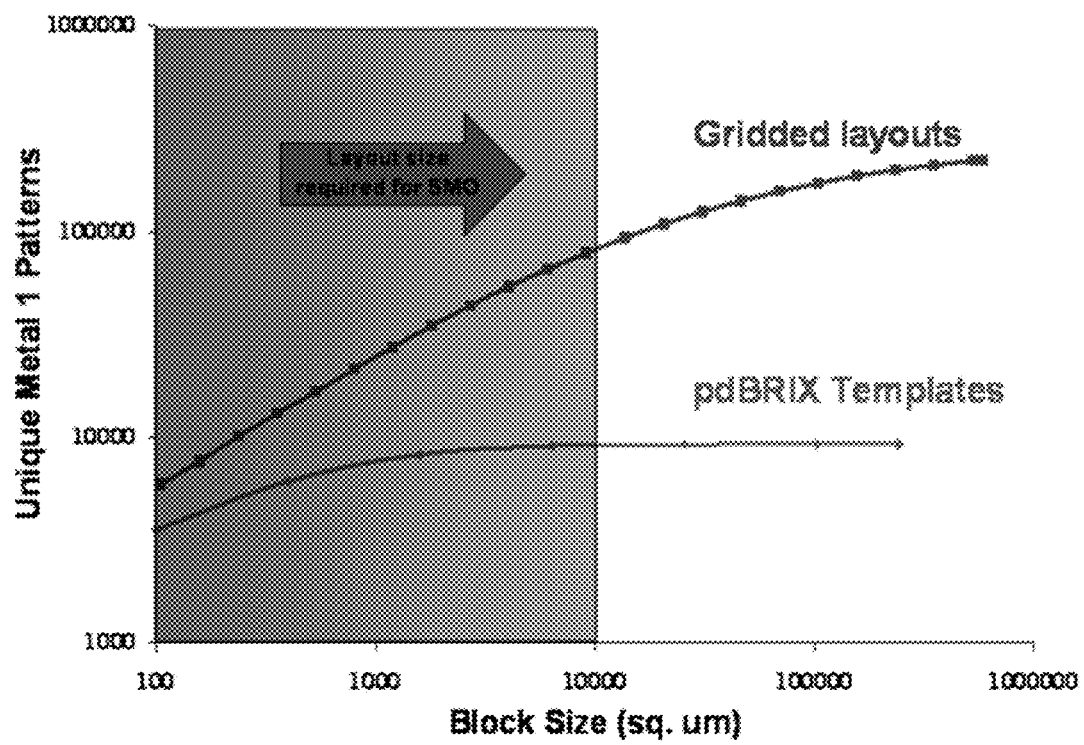
FIG. 9 exemplifies the growth in pattern count as a function of layout size for exemplary layouts utilizing the invention and prior-art approaches. As can be readily appreciated, using the invention: SMO complexity reduces and quality improves with the tighter pattern restrictions; >10× reduction in raw patterns; and pattern counts saturate at block sizes of about 40×40 μm.
Figure 10:
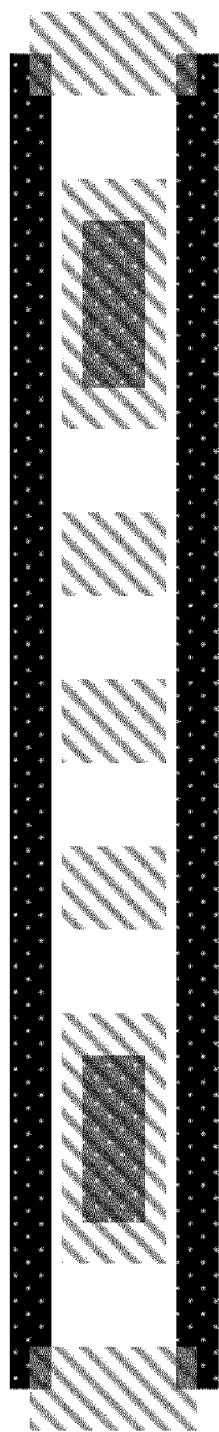
FIG. 10 shows an exemplary base template (for an 8 track library with bidirectional M2).
Figure 11:
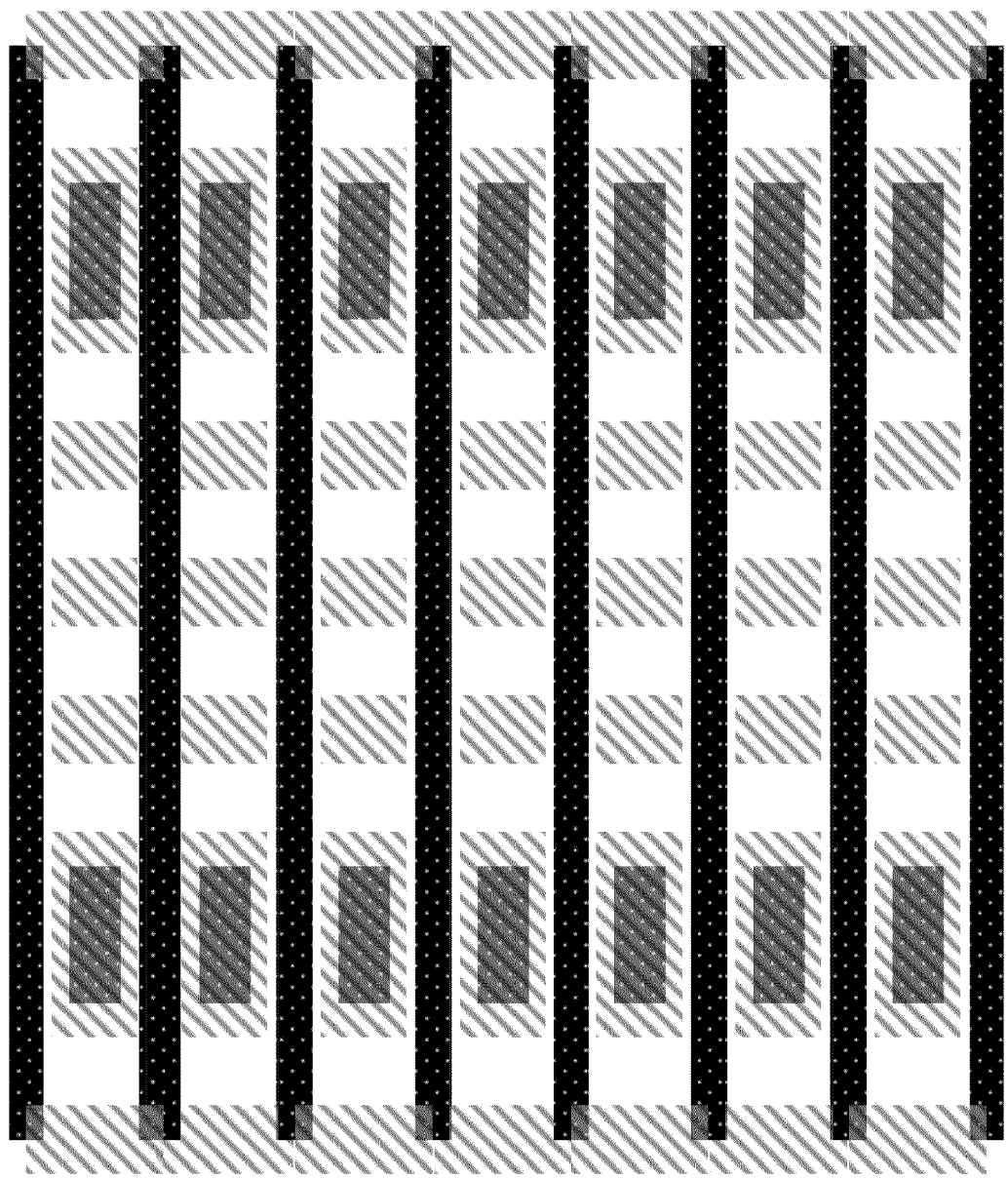
FIG. 11 shows a collection of abutted base templates of the design depicted in FIG. 10.
Figure 12A:
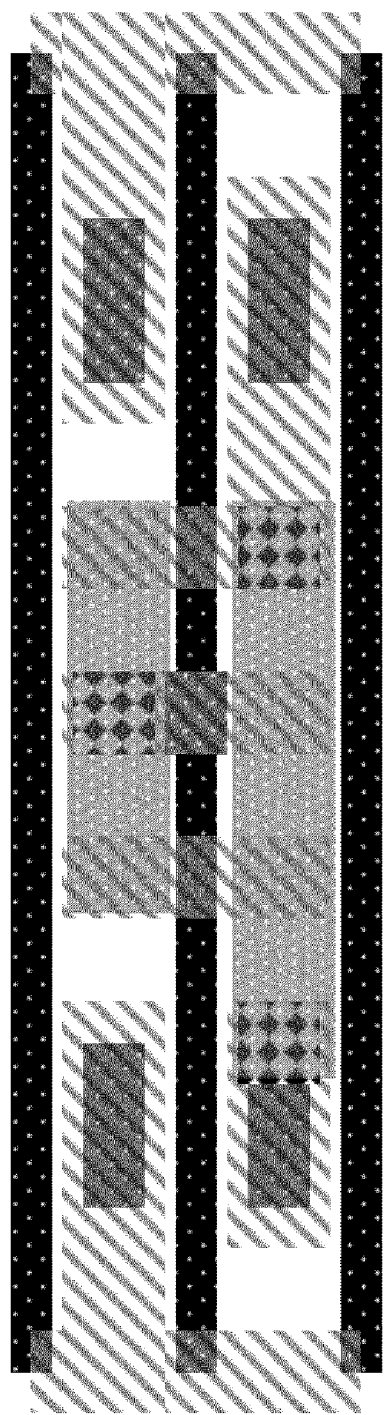
FIG. 12A depicts an exemplary inverter cell formed from the base templates of FIGS. 10-11.
Figure 12B:
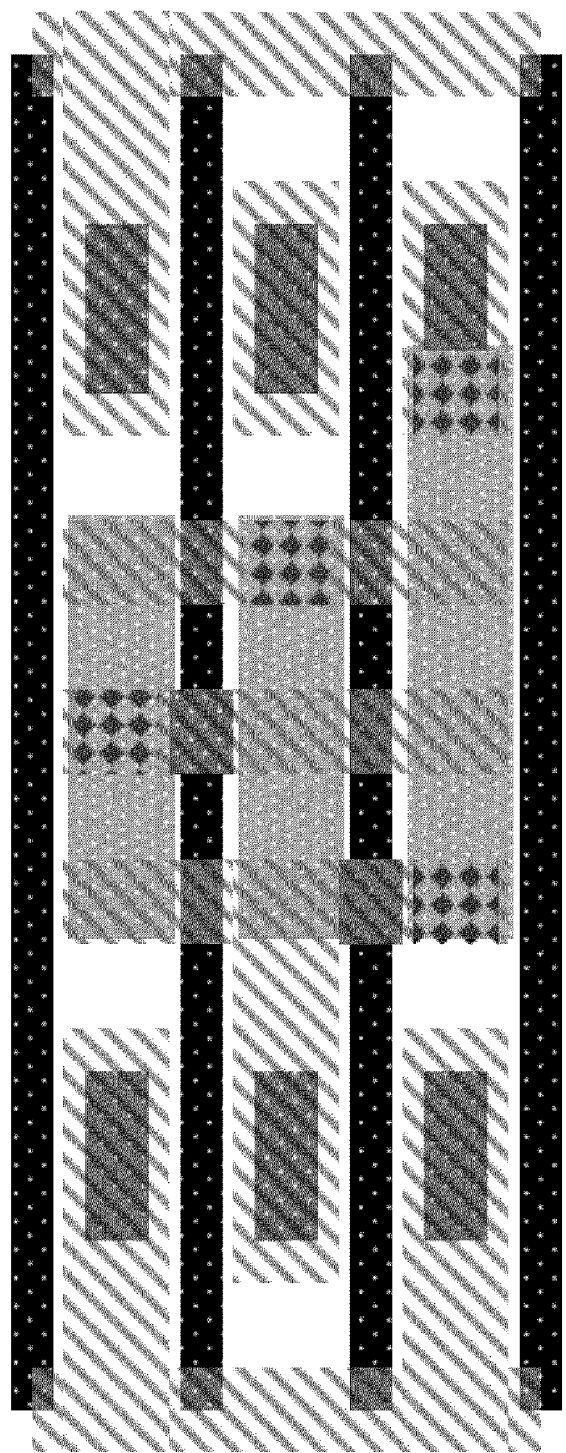
FIG. 12B depicts an exemplary nand2 cell formed from the base templates of FIGS. 10-11.
Figure 12C:
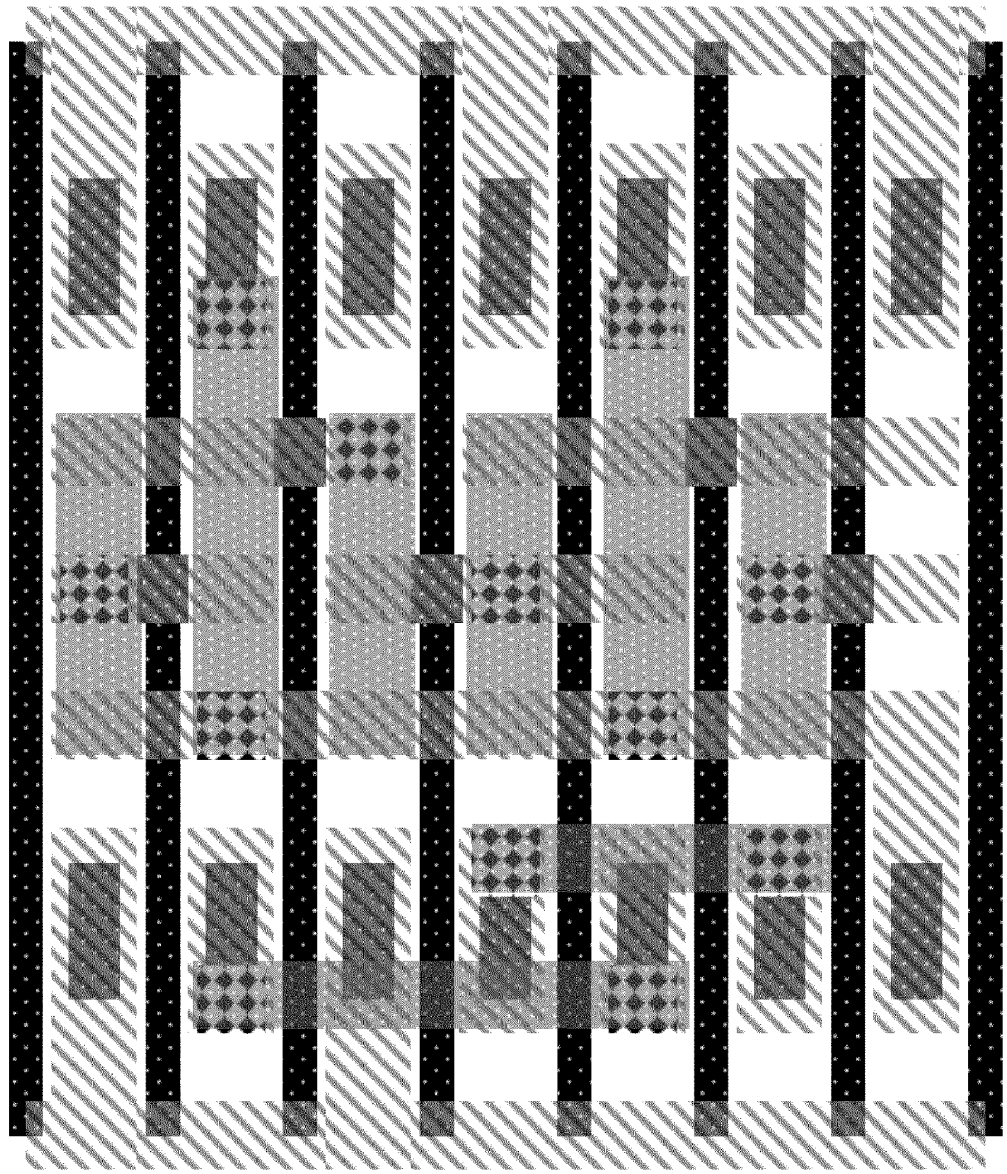
FIG. 12C depicts an exemplary aoi221 cell formed from the base templates of FIGS. 10-11. The layouts of FIGS. 12A-C represent no area penalty, as compared to conventional, non-pattern controlled approaches.
Figure 13A:
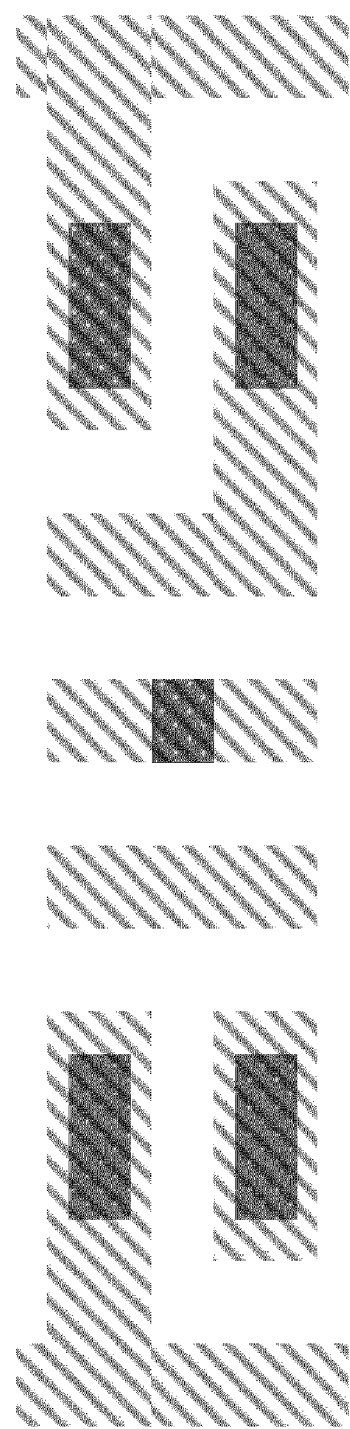
FIGS. 13A-C show the M1 patterning of the layouts shown in FIGS. 12A-C, respectively.
Figure 13B:
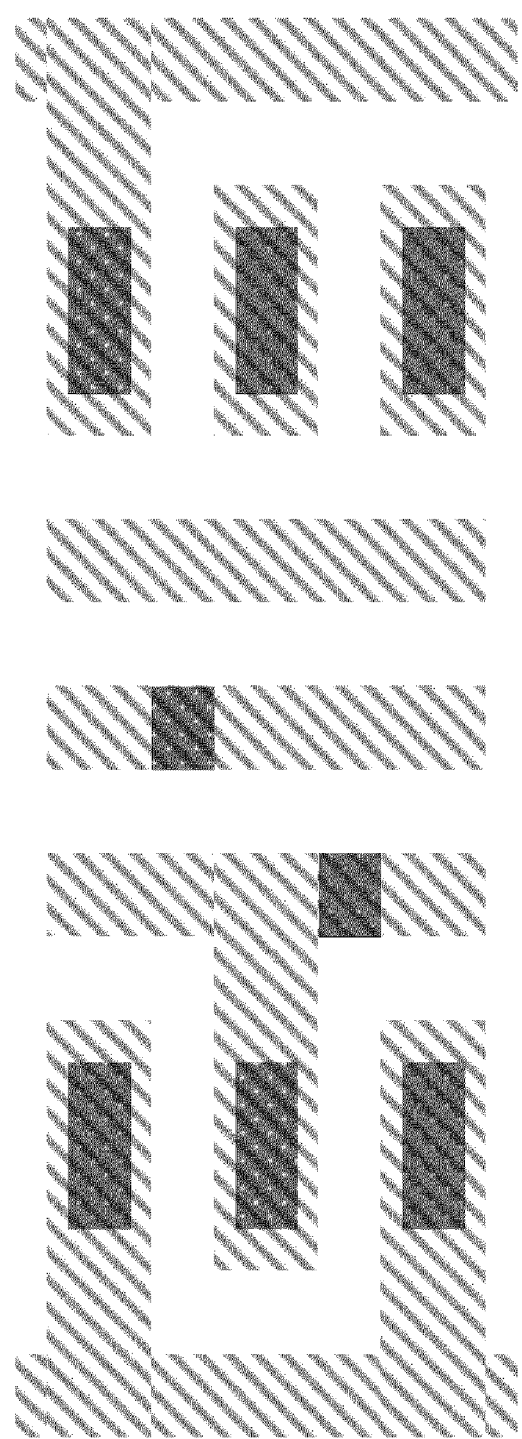
Figure 13C:
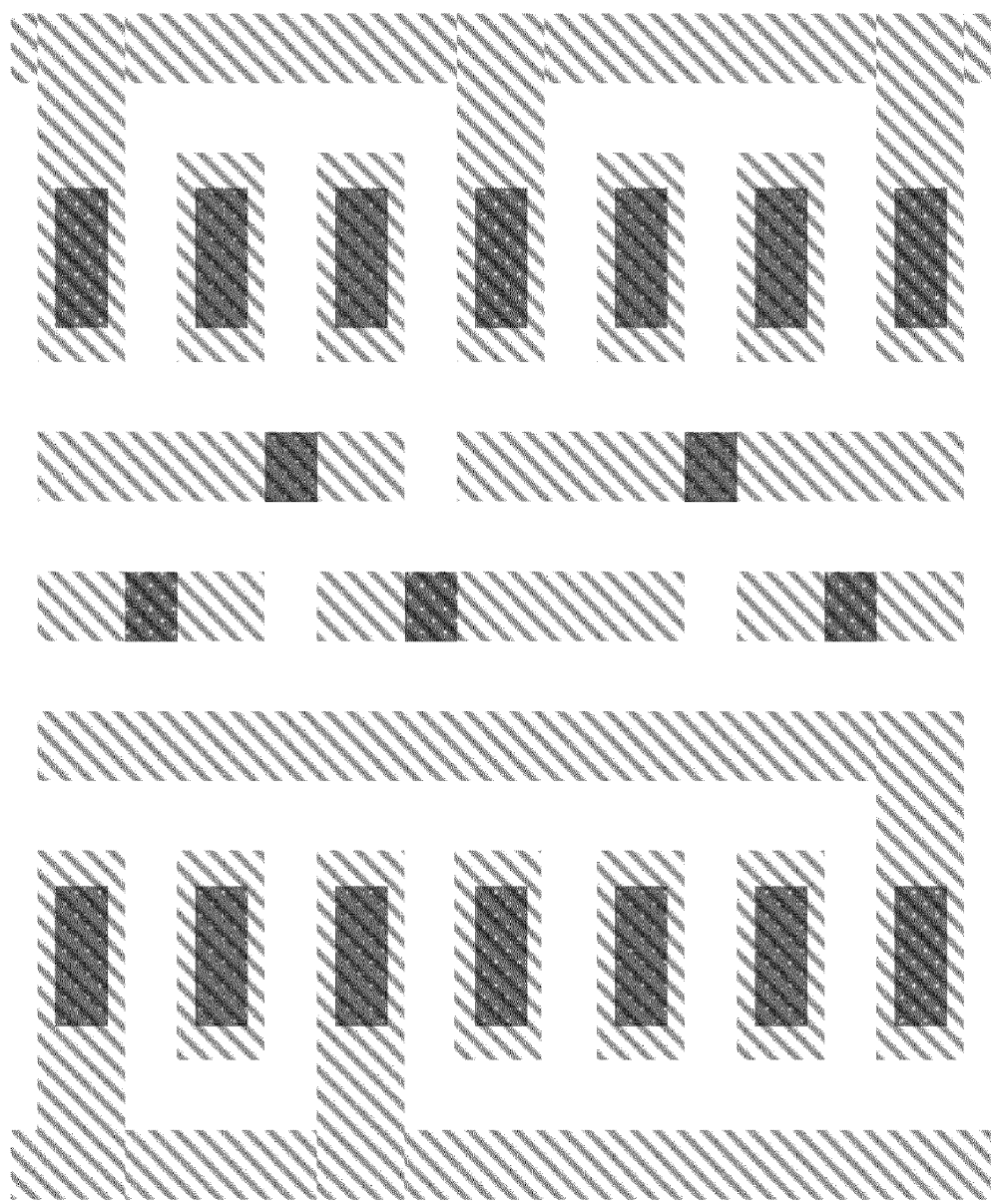
Figure 14A:
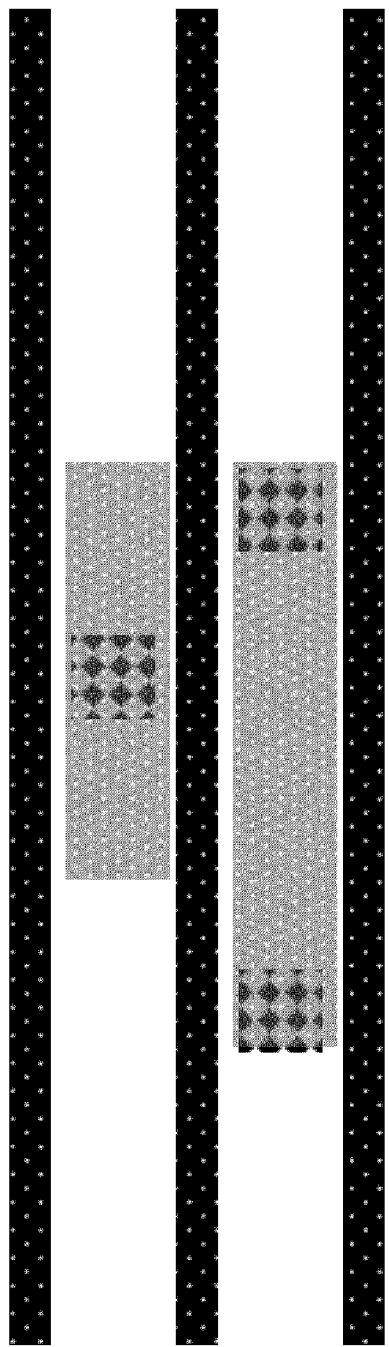
FIGS. 14A-C show the M2 and poly patterning of the layouts shown in FIGS. 12A-C, respectively.
Figure 14B:
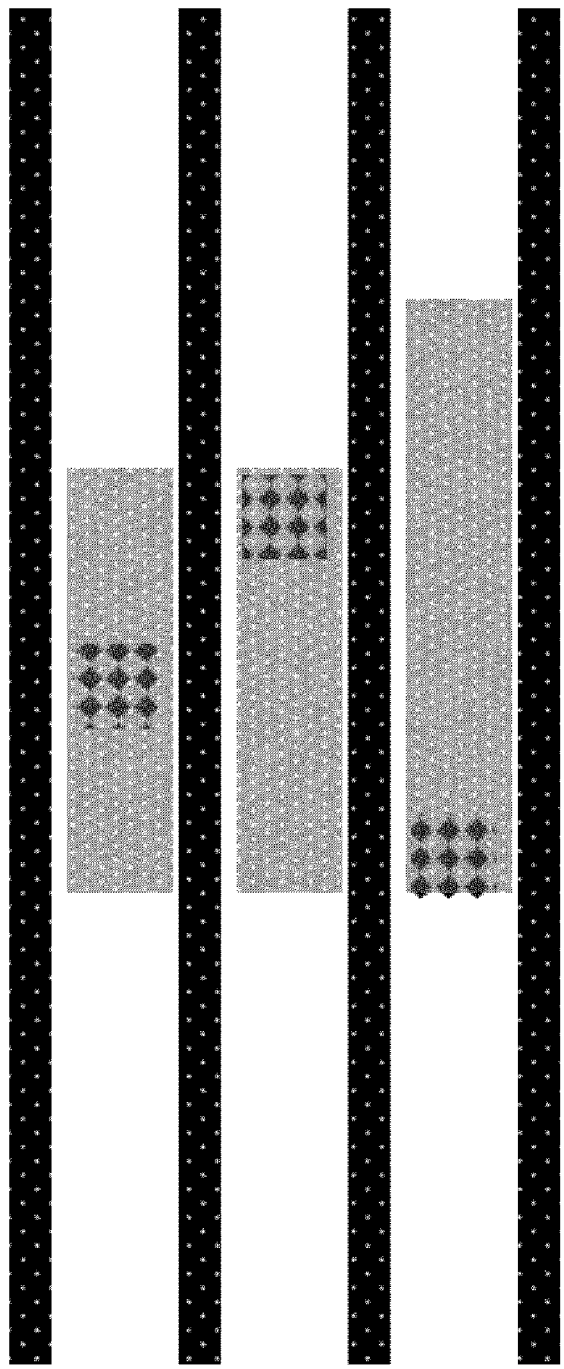
Figure 14C:
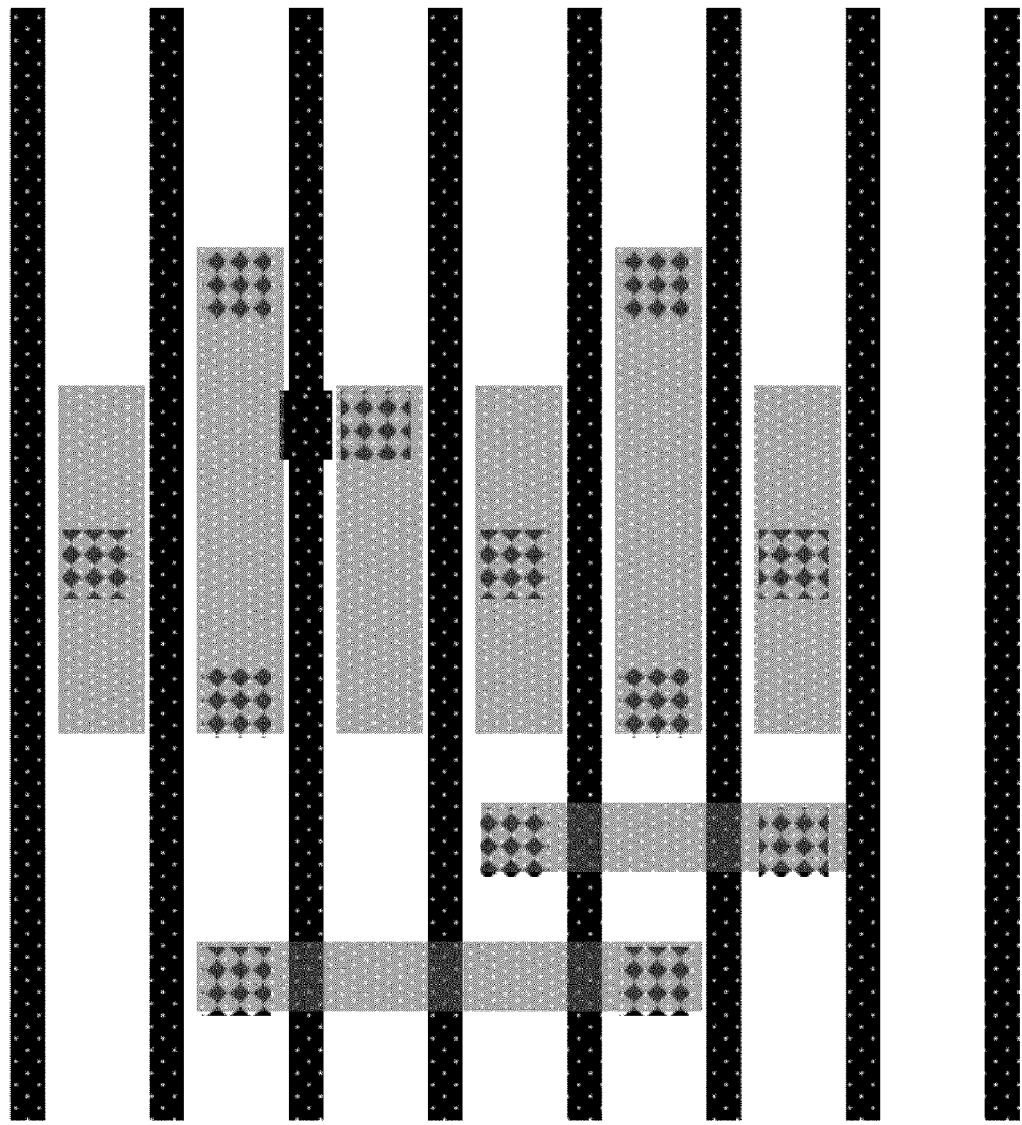
Figure 15A:
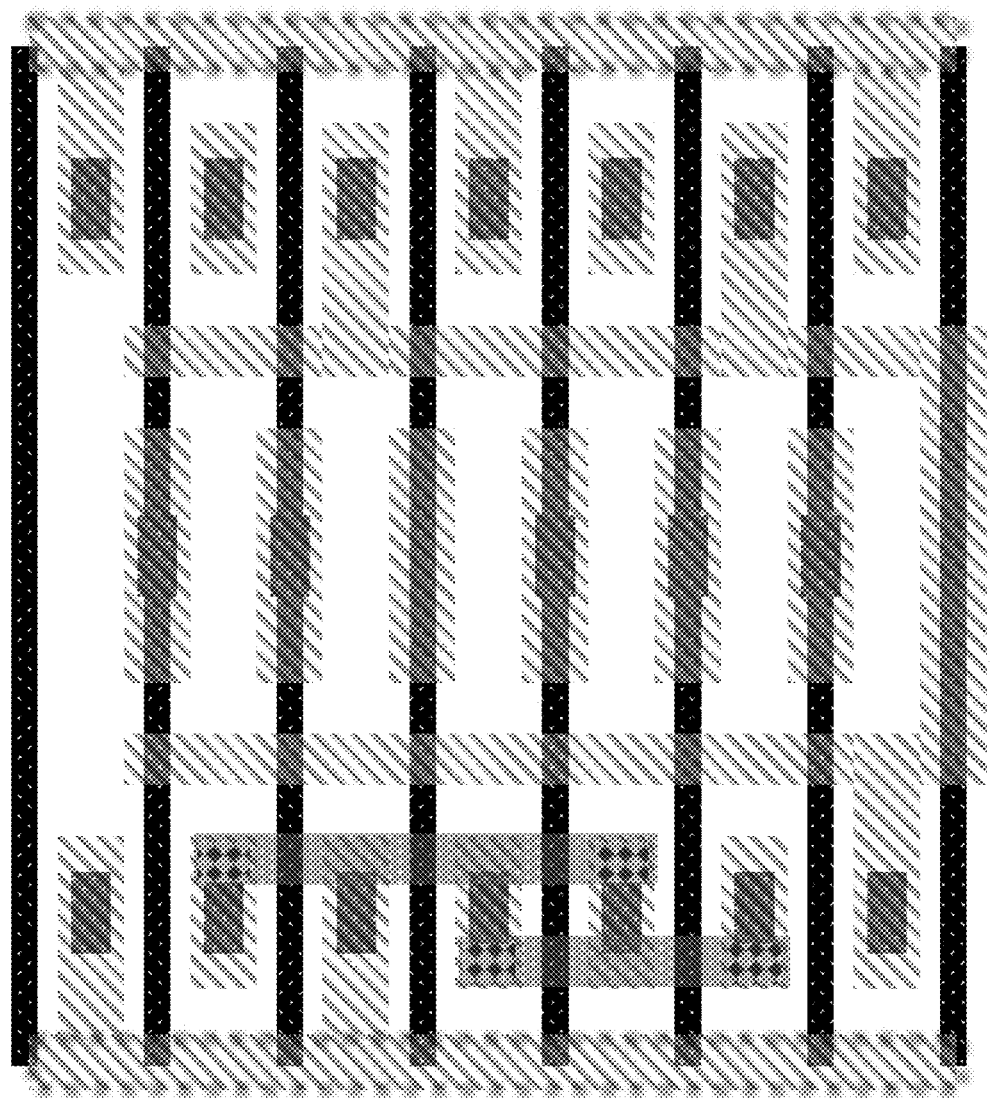
FIGS. 15A-H highlight various characteristics of the exemplary or 22ao22nand2 cell depicted in FIG. 6C.
Figure 15B:
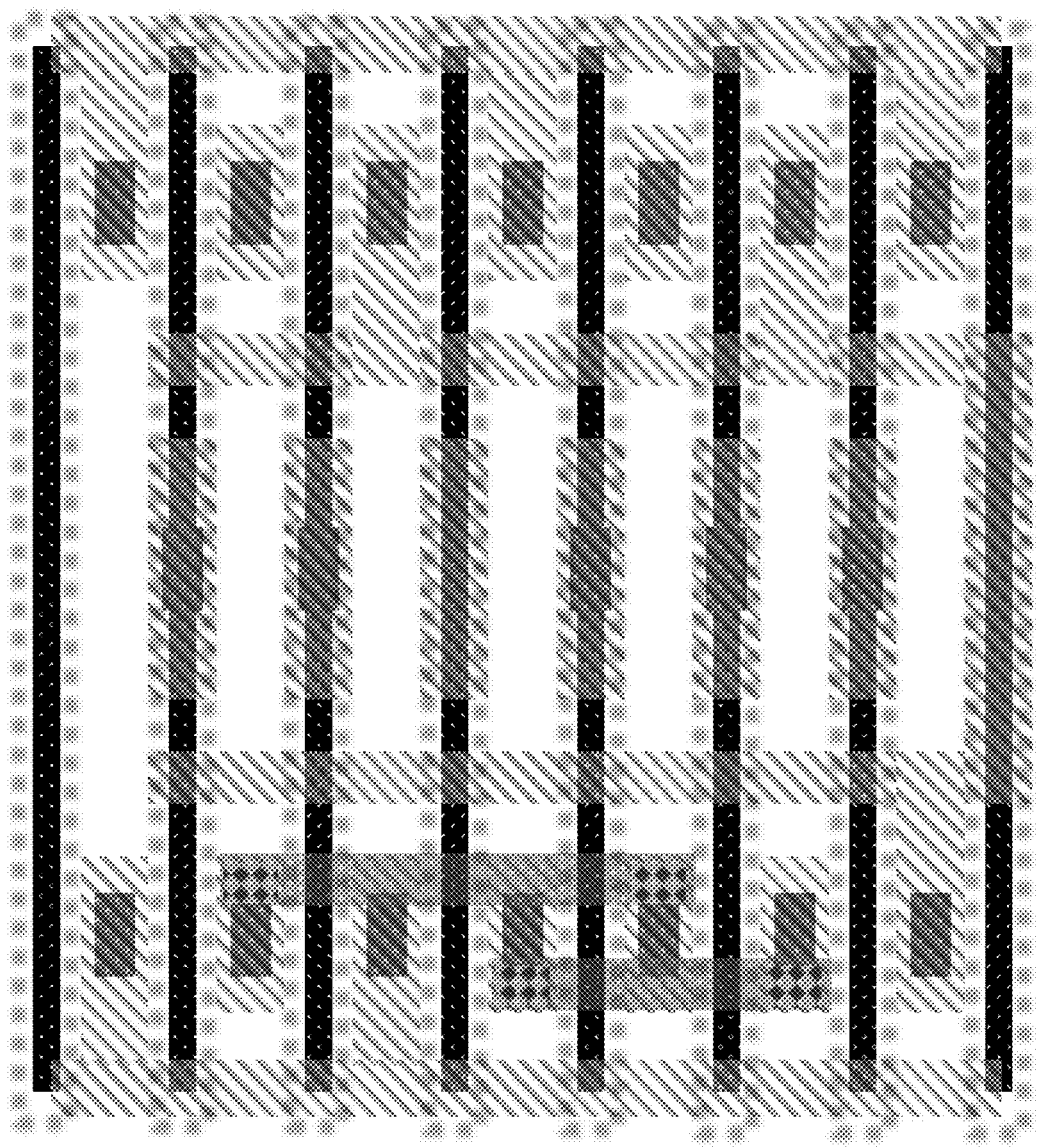
Figure 15C:
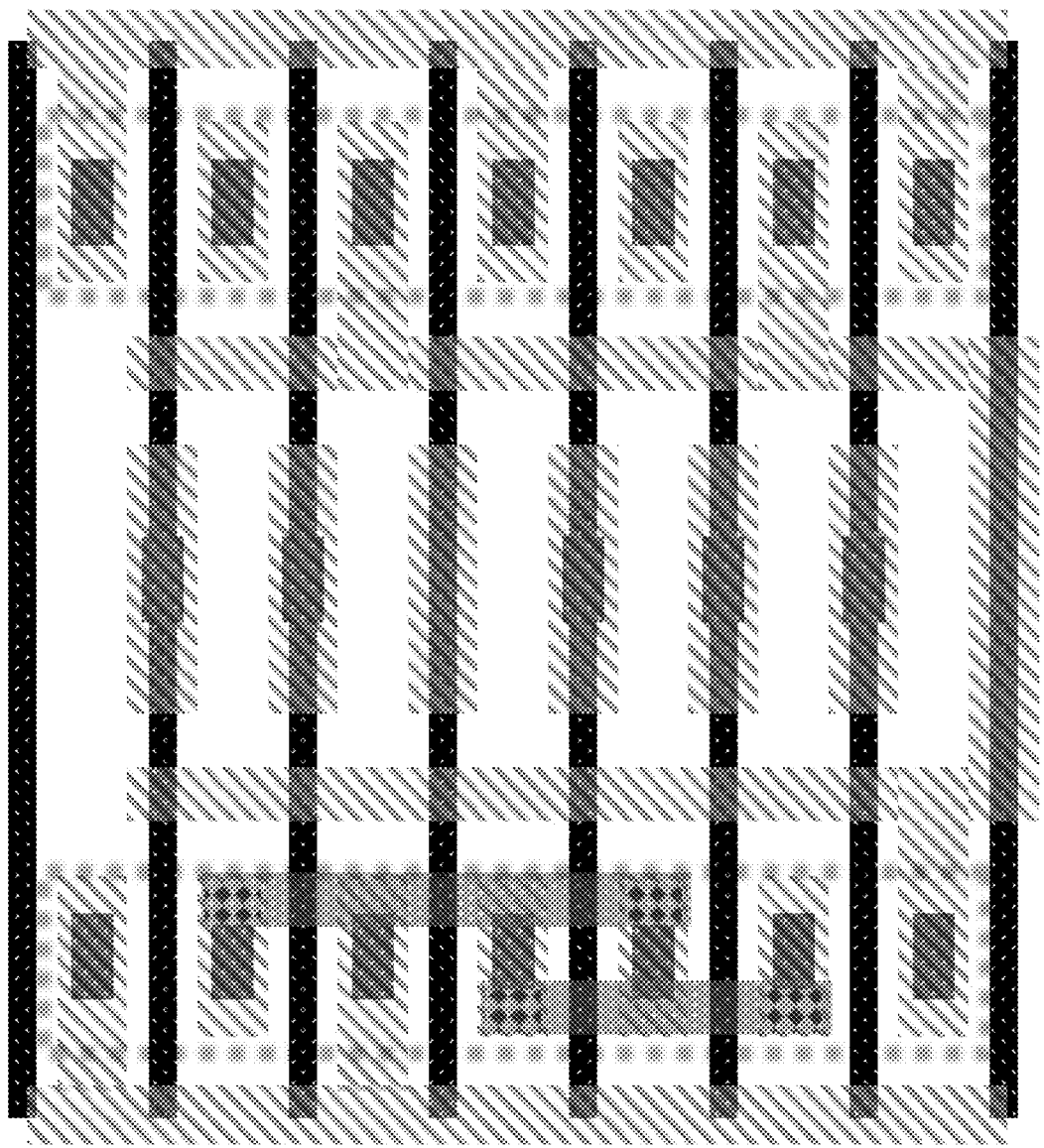
Figure 15D:
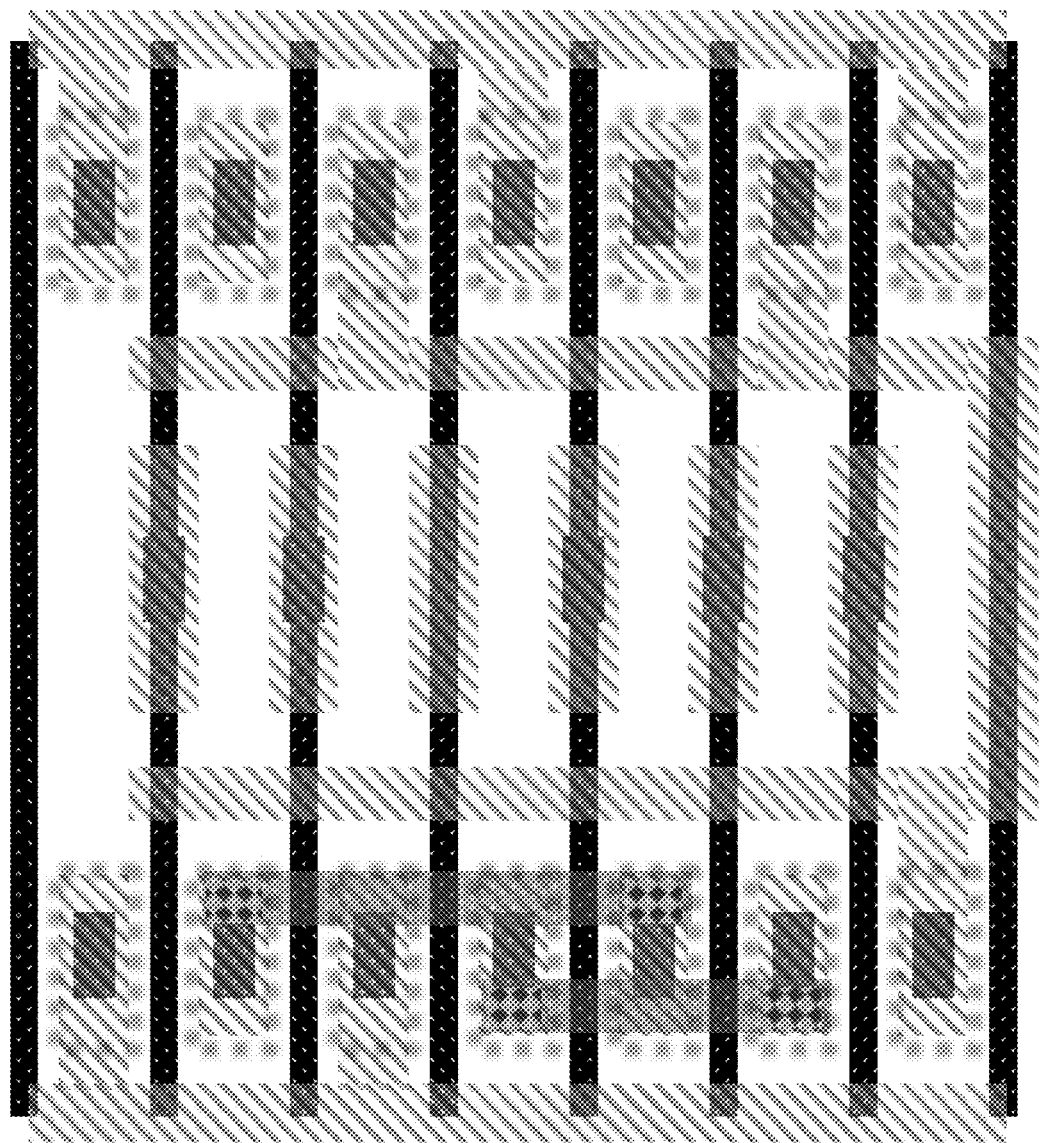
Figure 15E:
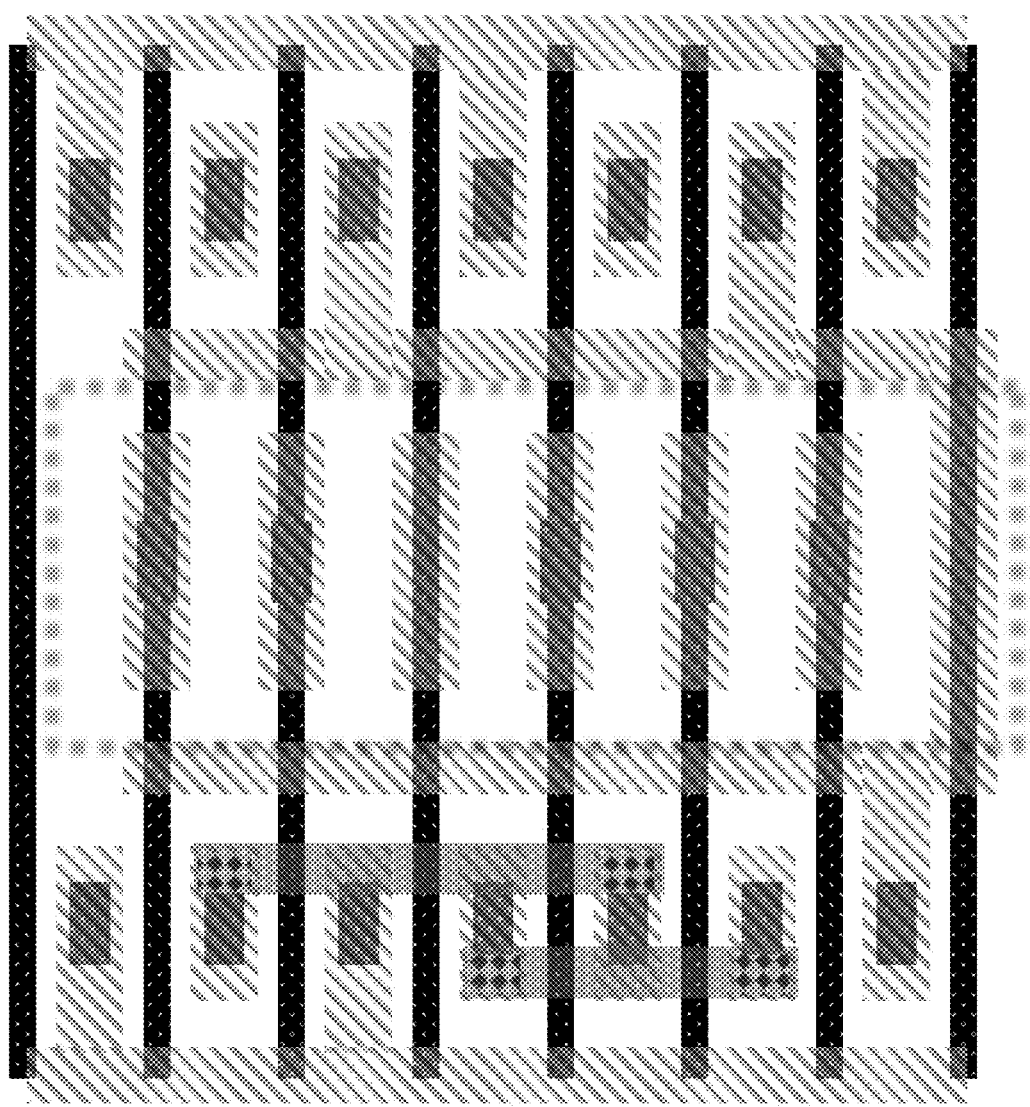
Figure 15F:
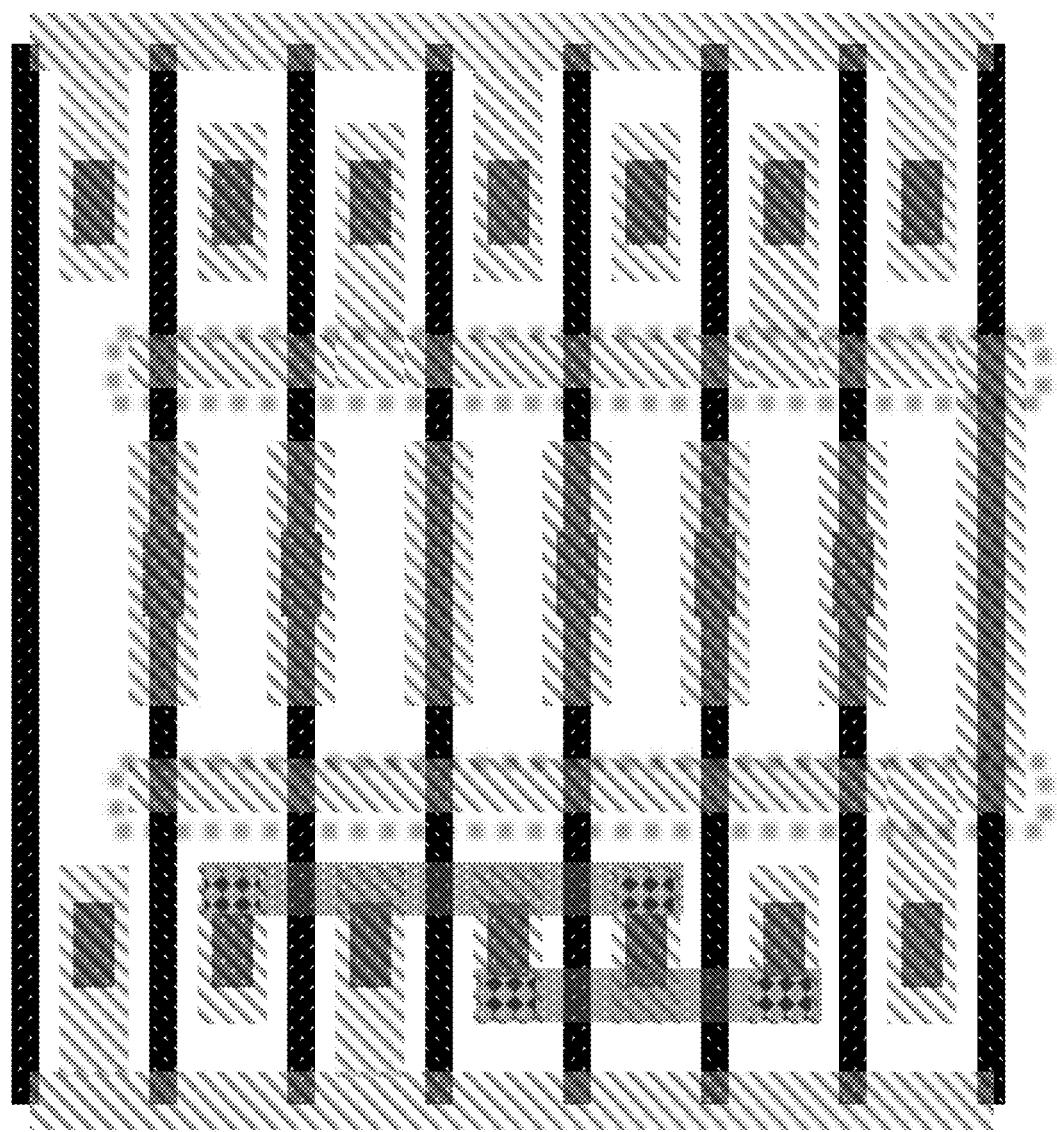
Figure 15G:
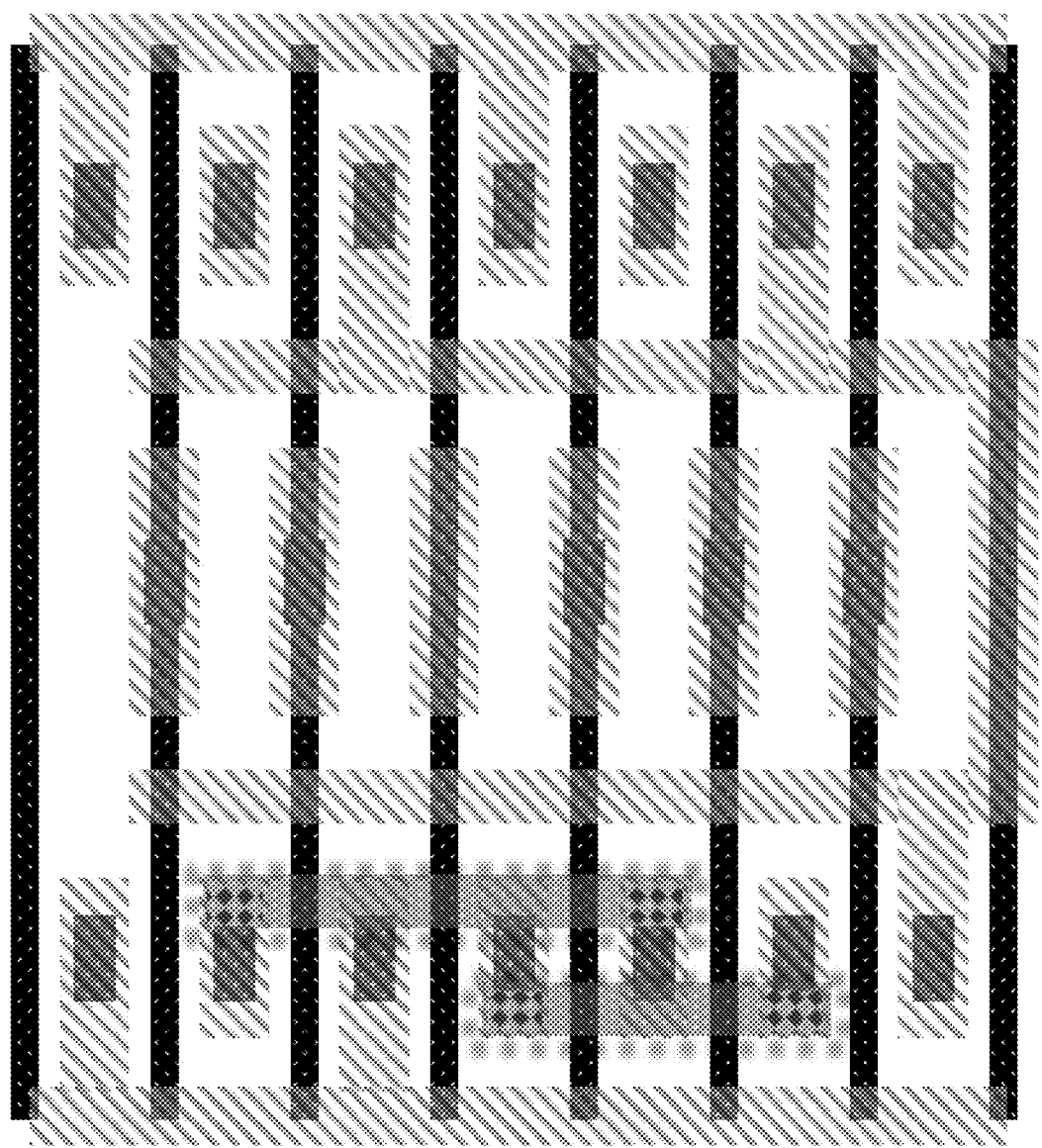
Figure 15H:
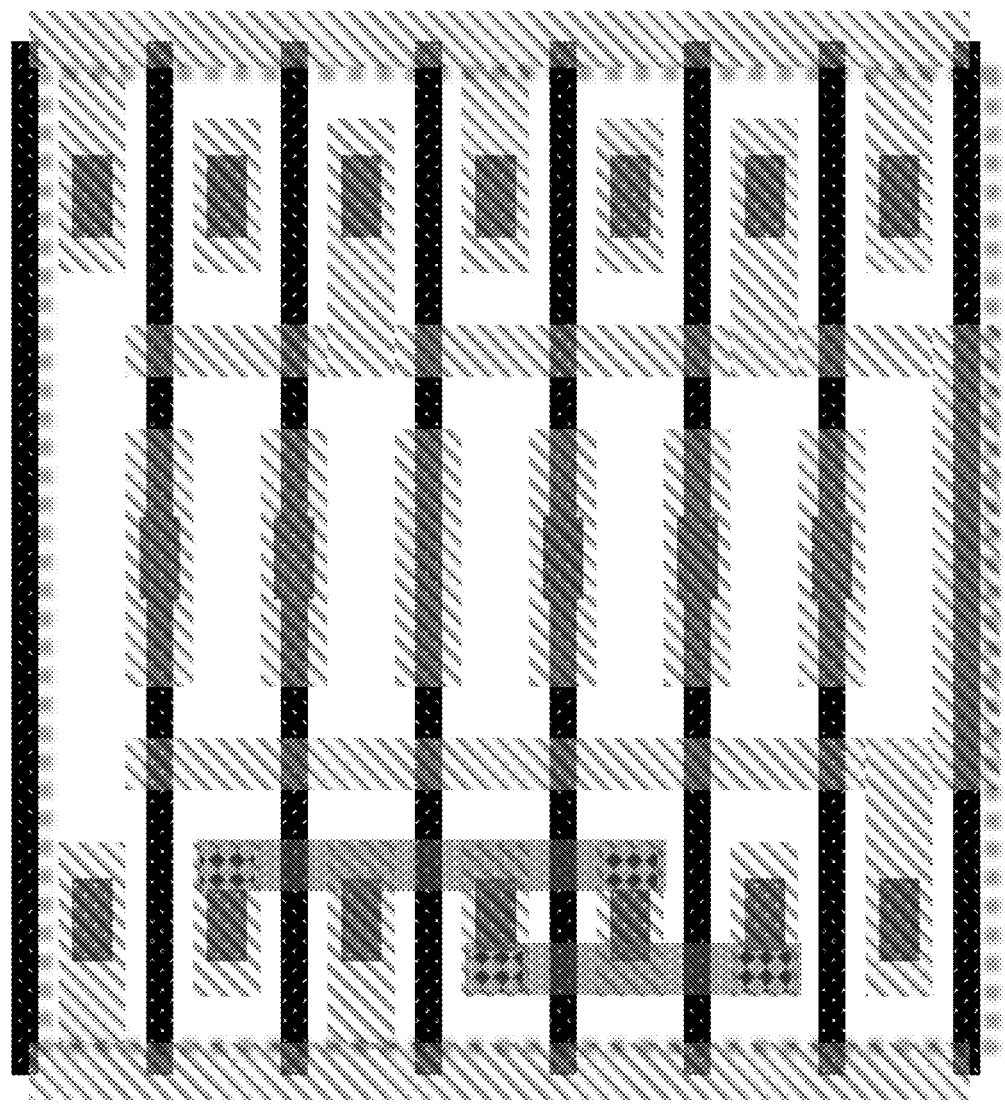

A logic circuit implemented in a region of an integrated circuit using a reduced pattern complexity design style, said logic circuit comprising:

uniform width, elongated, parallel positive and negative supply rails [highlighted in FIG. 15A] extending in a first direction [horizontal in FIGS. 15A-H] in a first metal layer;

at least six [or 8, 12, 15 or more] identically shaped, elongated, unbroken (embodiments that permit a break in the poly to support transmission gates, tri-state cells, or analog functions are also possible and potentially useful in some applications), parallel, uniformly spaced and uniform width polysilicon stripes [highlighted in FIG. 15B], each polysilicon stripe extending longitudinally in a second direction [vertical in FIGS. 15A-H], perpendicular to the first direction, and spanning substantially the entire distance between opposing positive and negative supply rails;

only two elongated diffusion stripes (each diffusion stripe can be continuous (preferred) or segmented) [locations highlighted in FIG. 15C, but actual diffusion geometry not depicted], of different types, both located between said opposing positive and negative supply rails, a first of said diffusion stripes extending in the first direction in a first [upper in FIG. 15C] region proximate to the positive supply rail, and a second of said diffusion stripes extending in the first direction in a second [lower in FIG. 15C] region proximate the negative supply rail;

between each pair of adjacent polysilicon stripes, at least first and second elongated segments extending longitudinally in the second direction in the first metal layer [highlighted in FIG. 15D], the first [upper in FIG. 15D] elongated segment located within the first region, and the second [lower in FIG. 15D] elongated segment located within the second region;

located in a third region [highlighted in FIG. 15E] between said first and second regions, a plurality of third elongated segments extending longitudinally in the second direction in the first metal layer, each of said third elongated segments overlying a respective one of said polysilicon stripes;

multiple connecting segments, including plural elongated connecting segments extending longitudinally in the first direction in the first metal layer [highlighted in FIG. 15F] and plural elongated connecting segments extending longitudinally in the first direction in a second metal layer [highlighted in FIG. 15G];

wherein (i) the connecting segments provide connections that implement logic function(s); and (ii) a region bounded by the opposing supply rails and outermost polysilicon stripes [highlighted in FIG. 15H] is substantially fully populated with connecting segment(s) and/or dummy feature(s) in the first metal layer, but not substantially fully populated with connecting segment(s) and/or dummy feature(s) in the second metal layer. The implemented logic function(s) preferably include at least one non-standard complex Boolean logic function of at least three inputs, and such non-standard complex logic functions preferably employ a majority of the transistors contained within the region bounded by the opposing supply rails and outermost polysilicon stripes.

SECOND ILLUSTRATIVE EMBODIMENT

Bidirectional m2

FIGS. 16A-H

Figure 16A:
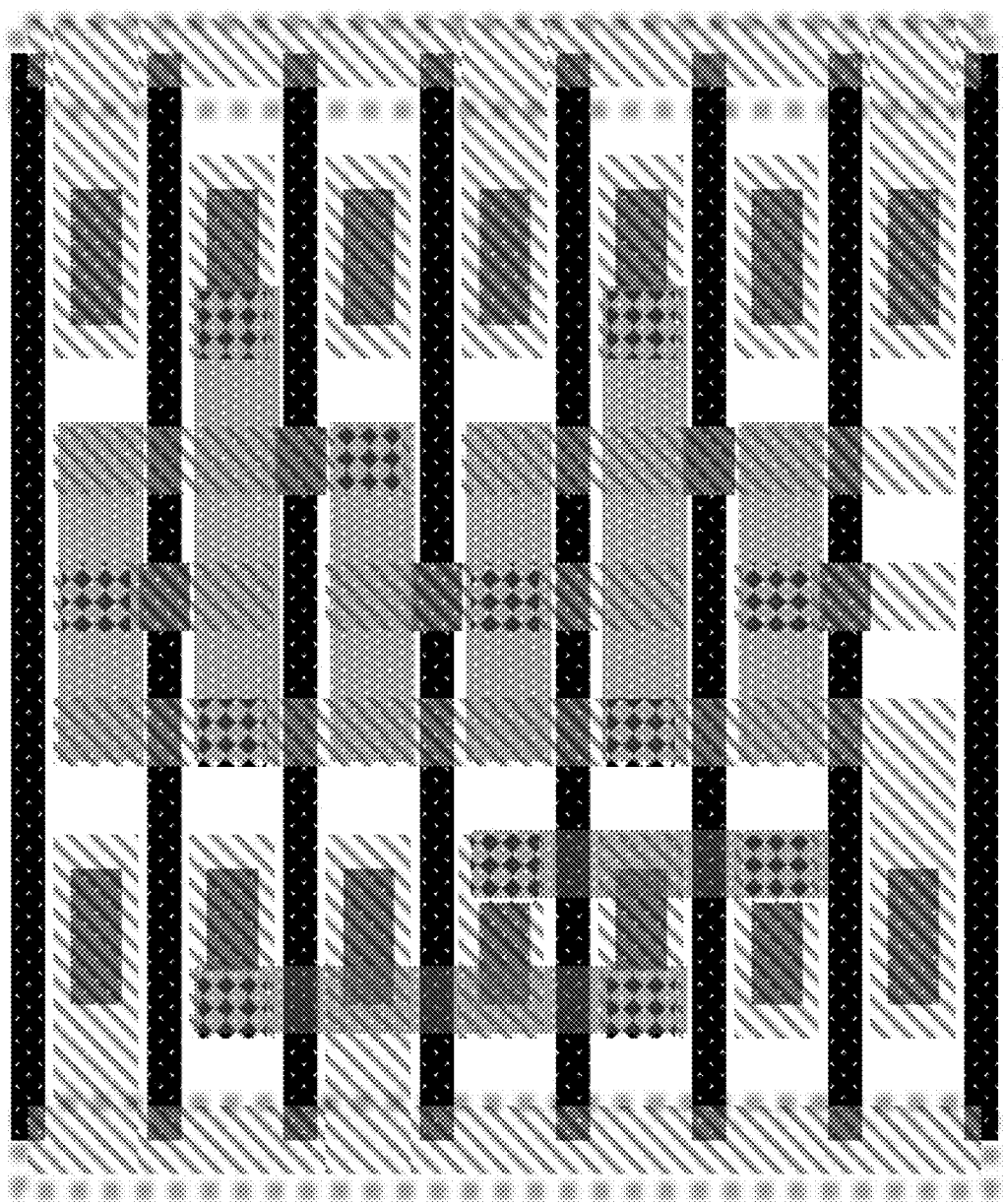
FIGS. 16A-H highlight various characteristics of the exemplary or 22ao22nand2 cell depicted in FIG. 12C.
Figure 16B:
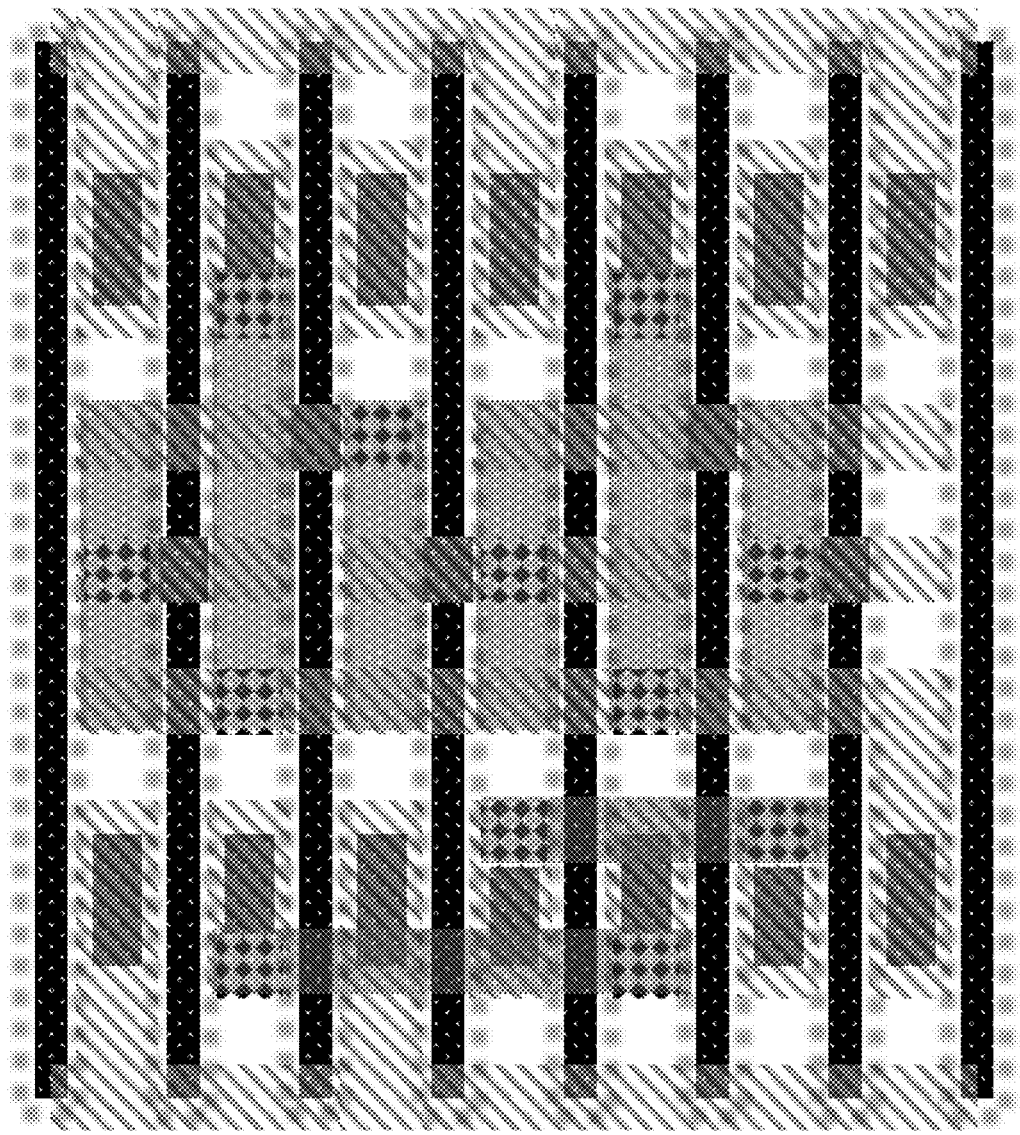
Figure 16C:
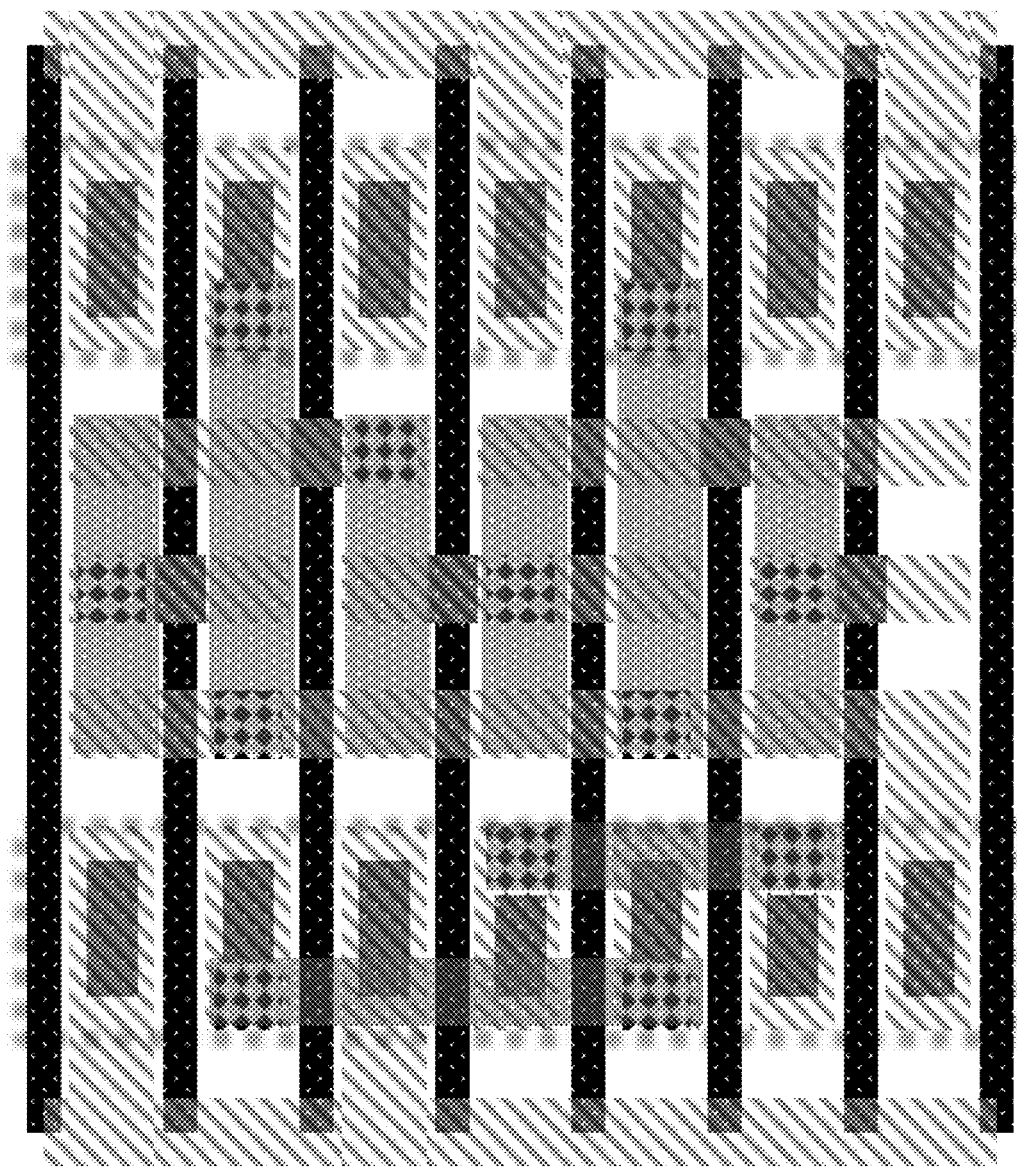
Figure 16D:
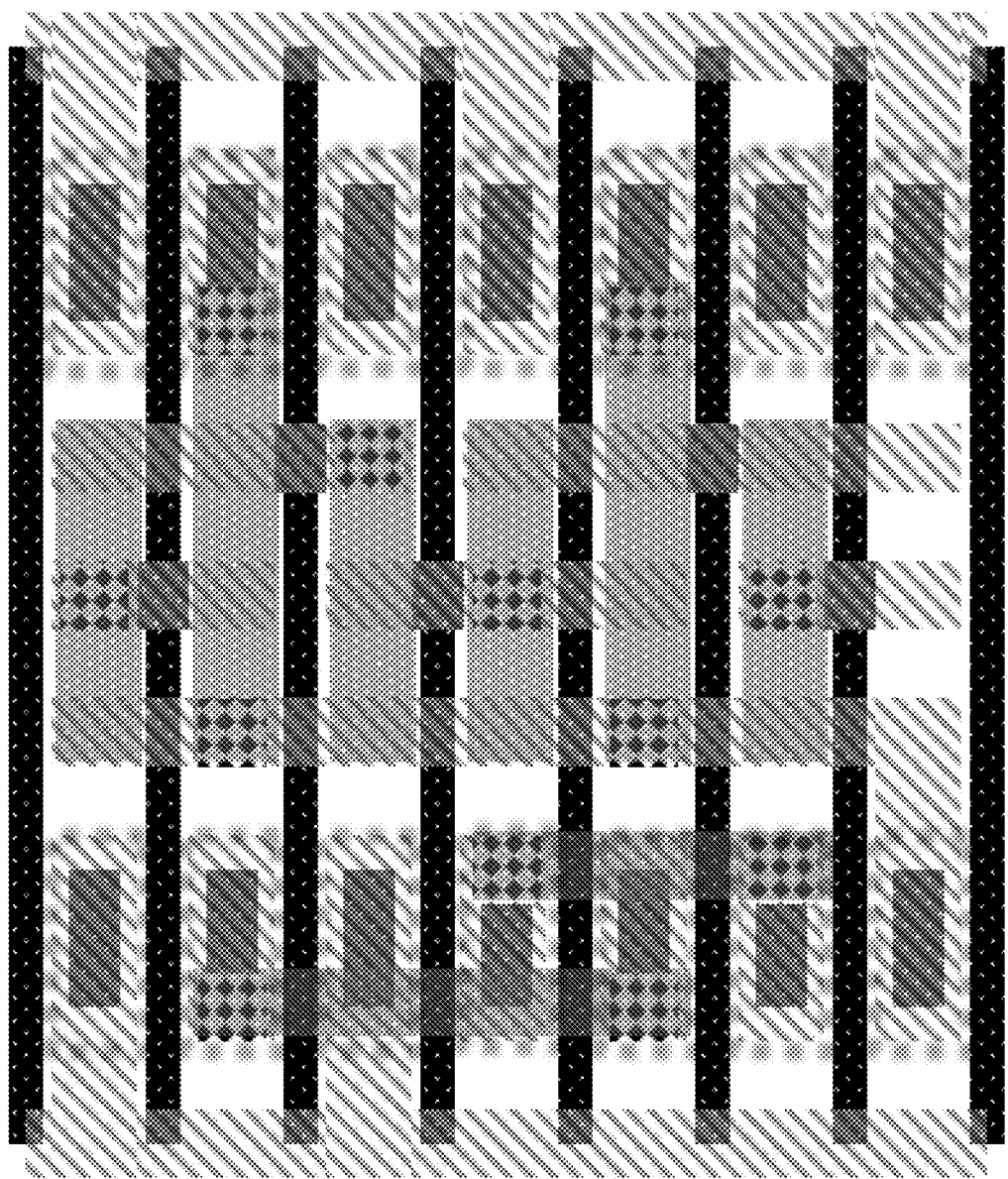
Figure 16E:
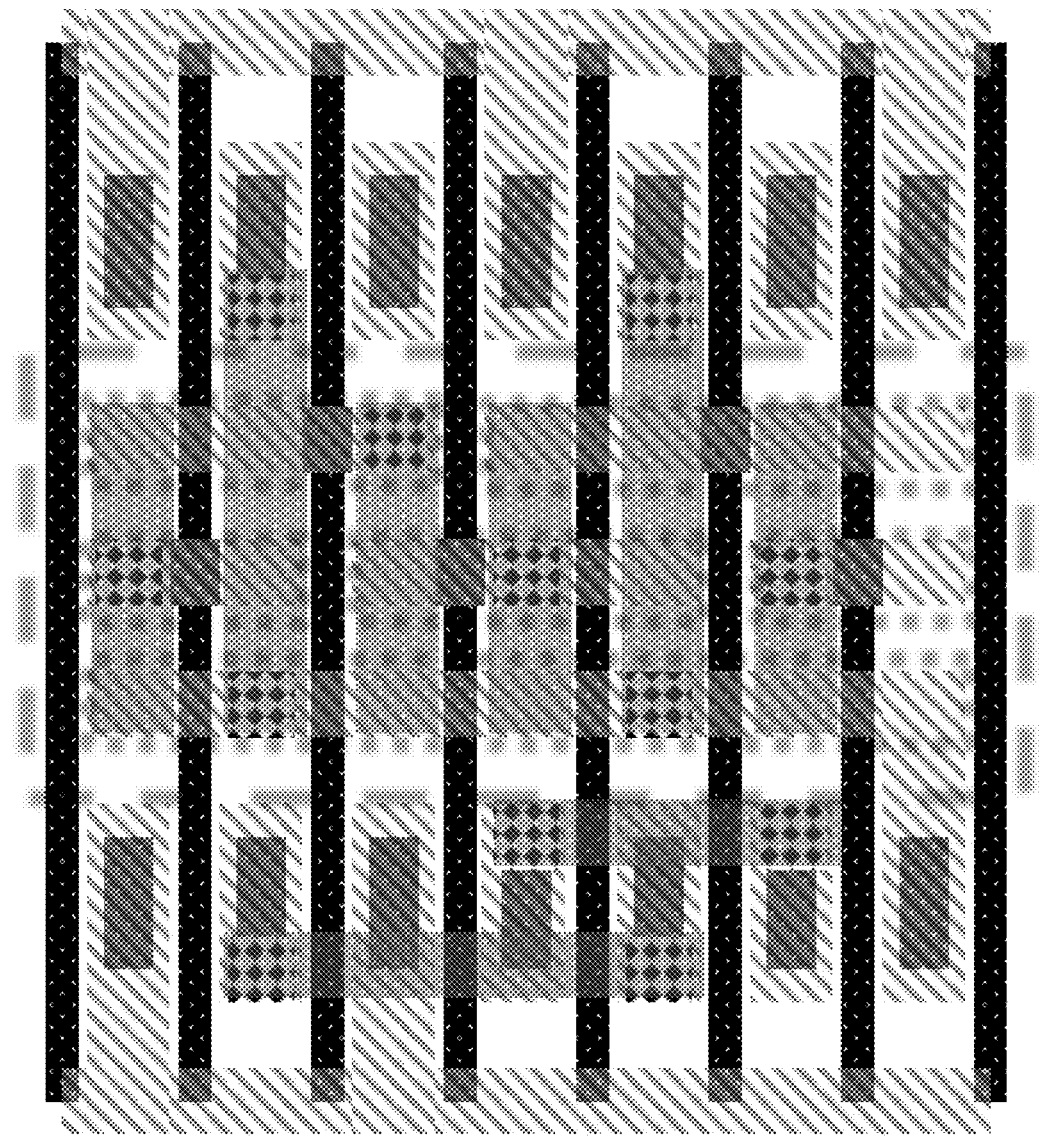
Figure 16F:
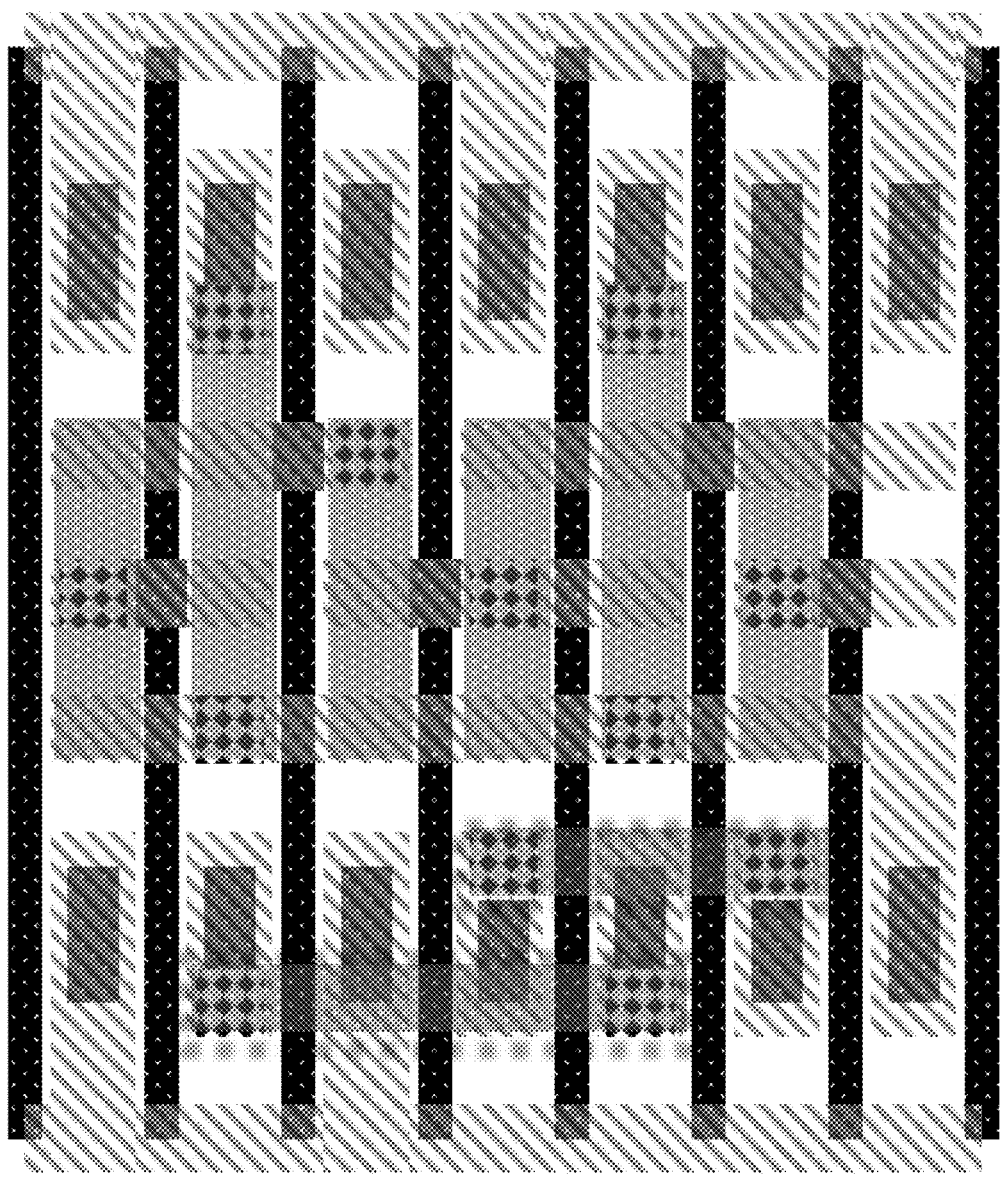
Figure 16G:
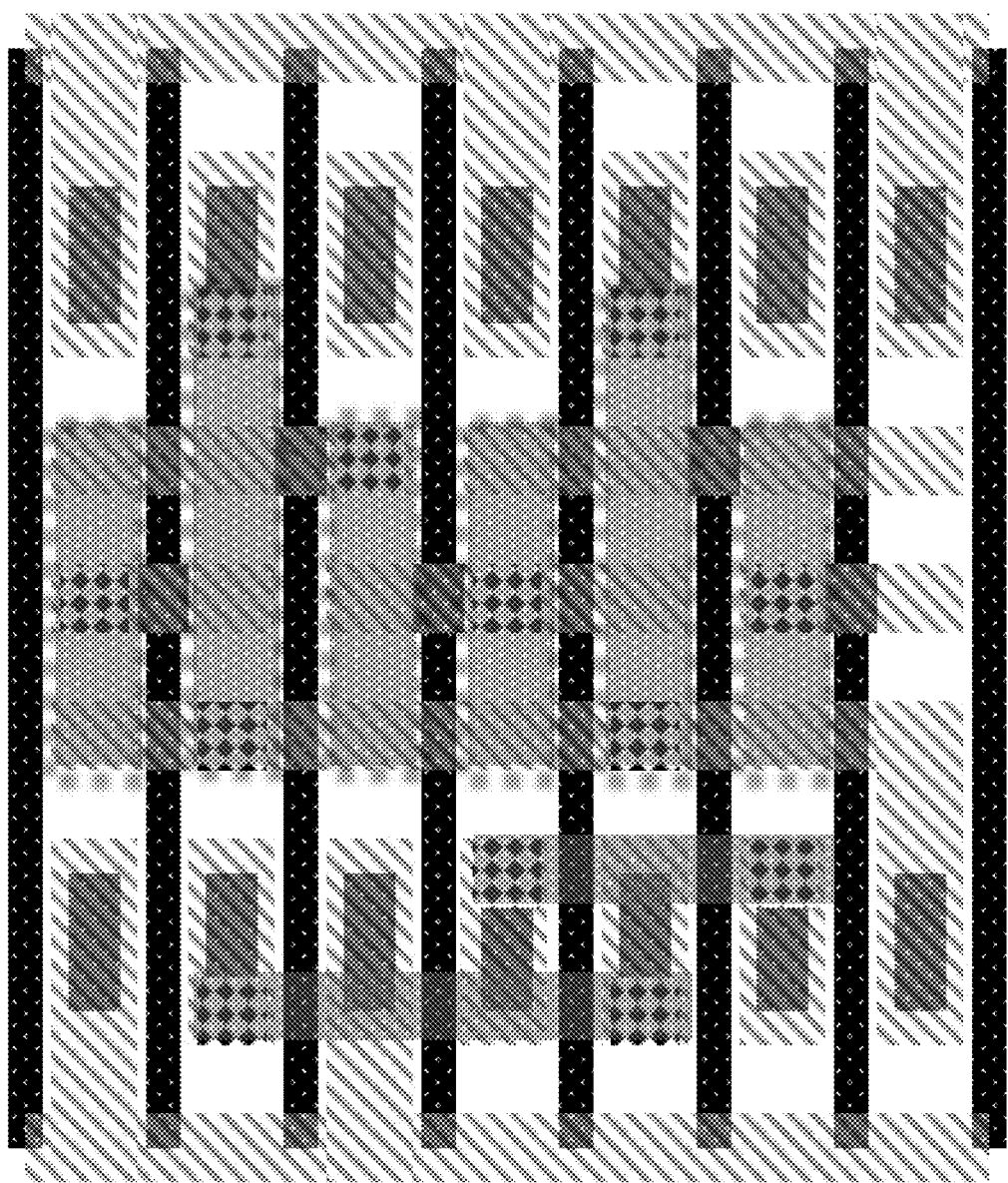
Figure 16H:
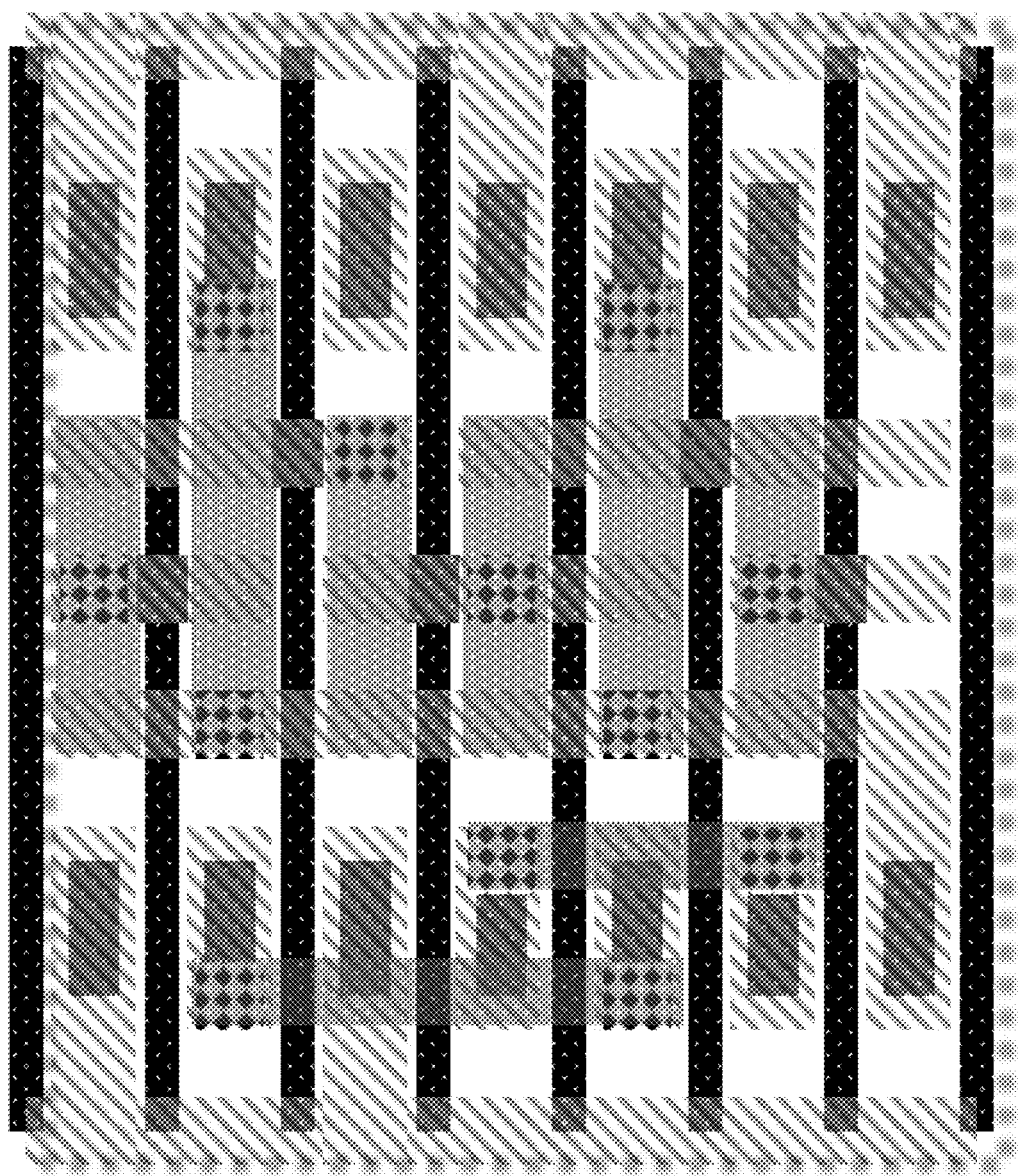

A logic circuit implemented in a region of an integrated circuit using a reduced pattern complexity design style, said logic circuit comprising:

uniform width, elongated, parallel positive and negative supply rails [highlighted in FIG. 16A] extending in a first direction [horizontal in FIGS. 16A-H] in a first metal layer;

at least six [or 8, 12, 15 or more] identically shaped, elongated, unbroken, parallel, uniformly spaced and uniform width polysilicon stripes [highlighted in FIG. 16B], each polysilicon stripe extending longitudinally in a second direction [vertical in FIGS. 16A-H], perpendicular to the first direction, and spanning substantially the entire distance between opposing positive and negative supply rails;

only two elongated diffusion stripes [locations highlighted in FIG. 16C, but actual diffusion geometry not depicted], of different types, both located between said opposing positive and negative supply rails, a first of said diffusion stripes extending in the first direction in a first [upper in FIG. 16C] region proximate to the positive supply rail, and a second of said diffusion stripes extending in the first direction in a second [lower in FIG. 16C] region proximate the negative supply rail;

between each pair of adjacent polysilicon stripes, at least first and second elongated segments extending longitudinally in the second direction in the first metal layer [highlighted in FIG. 16D], the first [upper in FIG. 16D] elongated segment located within the first region, and the second [lower in FIG. 16D] elongated segment located within the second region;

multiple connecting segments, including plural elongated connecting segments extending longitudinally in the first direction in the second metal layer [highlighted in FIG. 16F] and plural elongated connecting segments extending longitudinally in the second direction in a second metal layer [highlighted in FIG. 16G];

wherein (i) the connecting segments provide connections that implement logic function(s); and (ii) a region bounded by the opposing supply rails and outermost polysilicon stripes [highlighted in FIG. 16H] is substantially fully populated with connecting segment(s) and/or dummy feature(s) in the first metal layer, but not substantially fully populated with connecting segment(s) and/or dummy feature(s) in the second metal layer. The implemented logic function(s) preferably include at least one non-standard complex Boolean logic function of at least three inputs, and such non-standard complex logic functions preferably employ a majority of the transistors contained within the region bounded by the opposing supply rails and outermost polysilicon stripes.

Figure 17:
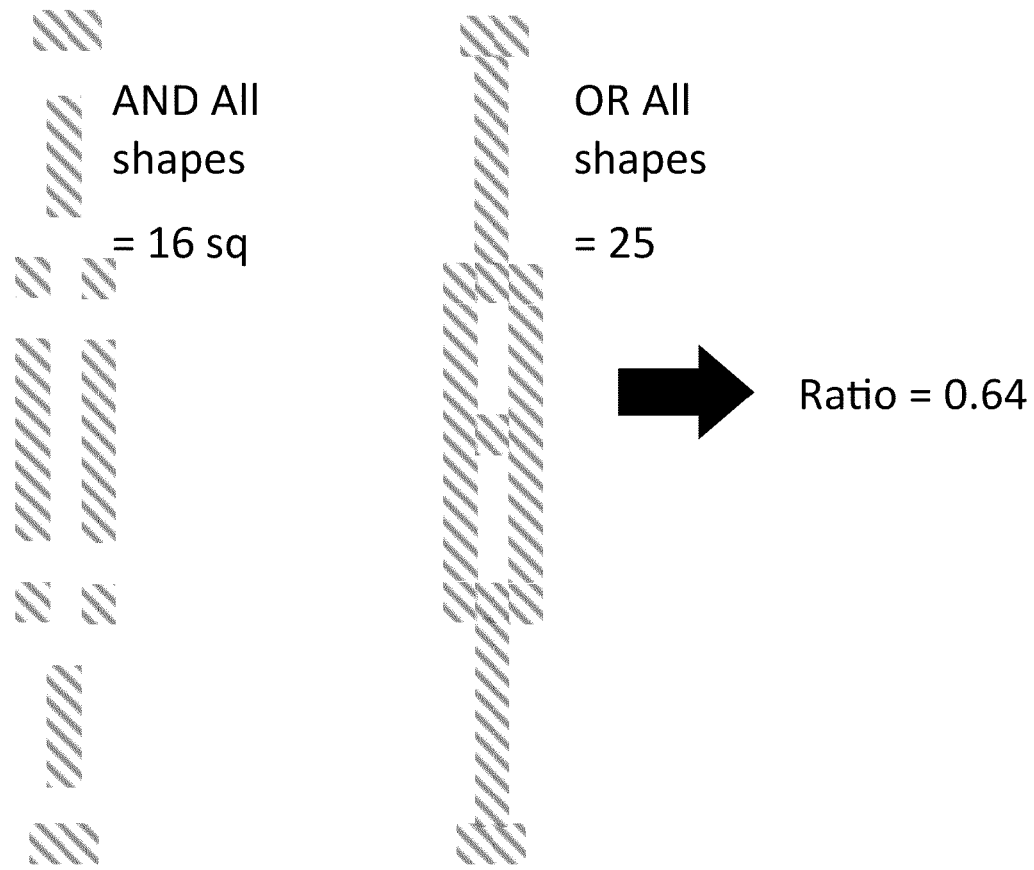
FIG. 17 illustrates the computation of a template regularity metric for an exemplary m1 mask.

Characterization of the Invention Based on Percentage of Shared, Common Geometry (FIG. 17)

Another aspect/advantage of the invention is that its layout patterns in the interconnect layers (e.g., m1, m2, via) are significantly more regular than previously known styles, even those that purport to be regular.

One way to characterize the regularity provided by the invention is to determine, within each baseTemplate frame, which geometry in a particular mask (e.g., m1, m2, via, etc.) is instantiated in every frame (thus making it part of the baseTemplate), versus only in some of the frames (making it part of a connectorTemplate). Dividing the baseTemplate's total instantiated area by the total instantiated area from all sources (e.g., baseTemplate and all connectorTemplates) in a given mask produces a "template regularity metric" that indicates the extent to which the baseTemplate defines the layout's geometry in a particular mask. The higher this metric, the fewer the number of unique patterns that a layout is likely to produce, and thus the more amenable the layout is to SMO optimization and the like.

Reference is now made to FIG. 17, which illustrates the computation of a template regularity metric for an exemplary m1 mask. As illustrated, the baseTemplate geometry is computed by a logical ANDing of all the m1 features in each baseTemplate frame (with the baseTemplate frame defined on two opposing sides by polysilicon stripes and on the other two opposing sides by metal power rails). Similarly, the instantiated area from all sources (baseTemplate and all connectorTemplates) is determined through a logical ORing of the m1 features in each baseTemplate frame. The example's template regularity metric for the m1 layer is then computed as the ratio, which in this case is 0.64, indicating that 64% of the instantiated m1 features are supplied by the baseTemplate.

Layouts produced in accordance with the invention display template regularity metrics that substantially exceed traditional gridded and other reduced complexity layout styles. In general, the invention will yield layouts with polysilicon template regularity metrics in the 90+% range, and metal template regularity metrics of greater than 50%, and preferably above 60%.

OTHER ASPECTS OF THE INVENTION

1. A method for making an integrated circuit having geometric features corresponding to at least active, poly, contact, m1, m2 and via layer patterning, said method comprising at least:

providing a silicon wafer to a fabrication line capable of rendering geometric features in said wafer at a resolution of 65 nm [or preferably 28 nm, or more preferably 22 nm] or less;

fabricating, using said fabrication line, the geometric features corresponding to said active, poly, contact, m1, m2 and via layer patterning;

wherein said fabricating includes creating, within a continuous region of at least $20 \times 20$ um$^2$ [or preferably $100 \times 100$ um$^2$, or $100 \times 100$ um$^2$, or $250 \times 250$ um$^2$, or $500 \times 500$ um$^2$], geometric features in the active, poly, m1, and m2 layers exclusively from patterning having been defined by:

instantiating at least 100 abutting instances of a predefined base template at a spacing corresponding to a minimum poly-to-poly pitch for the fabrication line, wherein said base template defines patterning corresponding to the active, poly, contact, m1, m2 and via layers of said integrated circuit;

instantiating one or more regular connector templates within a majority of the instantiated base templates, each regular connector template selected from a set of fewer than 20 [or preferably 10, or more preferably 5] types of regular connector templates, wherein each type of regular connector template defines patterning corresponding to the active, poly, contact, m1, m2 or via layer of said integrated circuit, and wherein each type of regular connector template is eligible for instantiation at between one and 5 locations relative to a reference location in its associated base template; and, instantiating one or more special connector templates within fewer than 10% [or preferably 5%, or more preferably 1%] percent of the instantiated base templates, each special connector template selected from a set of fewer than 4 [or preferably 3, or more preferably 2] types of special connector templates, wherein each type of special connector template defines patterning corresponding to the contact, m1, m2 or via layer of said integrated circuit, and wherein each type of special connector template is eligible for instantiation at a single location relative to a reference location in its associated base template.

2. A method for making an integrated circuit, as defined in claim 1, wherein the number of regular connector template types is no more than six.

3. A method for making an integrated circuit, as defined in claim 2, wherein the number of locations for each regular connector template type is no more than five.

4. A method for making an integrated circuit, as defined in claim 1, wherein the number of regular connector template types is no more than five.

5. A method for making an integrated circuit, as defined in claim 4, wherein the number of locations for each regular connector template type is no more than four.

6. A method for making an integrated circuit, as defined in claim 1, wherein special connector templates are instantiated within fewer than 20% of instantiated base templates.

7. A method for making an integrated circuit, as defined in claim 6, wherein special connector templates are instantiated within fewer than 15% of instantiated base templates.

8. A method for making an integrated circuit, as defined in claim 7, wherein special connector templates are instantiated within fewer than 10% of instantiated base templates.

9. A method for making an integrated circuit, as defined in claim 1, wherein the number of special connector template types is no more than four.

10. A method for making an integrated circuit, as defined in claim 9, wherein the number of special connector template types is no more than three.

11. A method for making an integrated circuit, as defined in claim 10, wherein the number of special connector template types is no more than two.

12. A method for making an integrated circuit, as defined in claim 1, wherein each regular connector template type is pre-qualified for instantiation at each eligible location regardless of which other regular connector templates are instantiated at neighboring locations.

13. A method for making an integrated circuit, as defined in claim 1, wherein each regular connector template type is selected for pattern compatibility with the associated base template.

14. An integrated circuit having geometric features corresponding to at least active, poly, contact, m1, m2 and via layer patterning, said integrated circuit made by a method comprising at least the following steps:
providing a silicon wafer to a fabrication line capable of rendering geometric features in said wafer at a resolution of 65 nm [or preferably 28 nm, or more preferably 22 nm] or less;
fabricating, using said fabrication line, the geometric features corresponding to said active, poly, contact, m1, m2 and via layer patterning;
wherein said fabricating includes creating, within a continuous region of at least $20 \times 20$ um$^2$ [or preferably $100 \times 100$ um$^2$, or $100 \times 100$ um$^2$, or $250 \times 250$ um$^2$, or $500 \times 500$ um$^2$], geometric features in the active, poly, m1, and m2 layers exclusively from patterning having been defined by:
instantiating at least 100 abutting instances of a predefined base template at a minimum poly-to-poly pitch for the fabrication line, wherein said base template defines patterning corresponding to the active, poly, contact, m1, m2 and via layers of said integrated circuit;
instantiating one or more regular connector templates within a majority of the instantiated base templates, each regular connector template selected from a set of fewer than 20 [or preferably 10, or more preferably 5] types of regular connector templates, wherein each type of regular connector template defines patterning corresponding to the active, poly, contact, m1, m2 or via layer of said integrated circuit, and wherein each type of regular connector template is eligible for instantiation at between one and 5 locations relative to a reference location in its associated base template; and,
instantiating one or more special connector templates within fewer than 10% [or preferably 5%, or more preferably 1%] of the instantiated base templates, each special connector template selected from a set of fewer than 4 [or preferably 3, or more preferably 2] types of special connector templates, wherein each type of special connector template defines patterning corresponding to the contact, m1, m2 or via layer of said integrated circuit, and wherein each type of special connector template is eligible for instantiation at a single location relative to a reference location in its associated base template.

15. A method for designing an integrated circuit having geometric features corresponding to at least active, poly, contact, m1, m2 and via layer patterning, said method comprising at least the following:
defining a continuous region of at least $20 \times 20$ um$^2$ [or preferably $100 \times 100$ um$^2$, or $100 \times 100$ um$^2$, or $250 \times 250$ um$^2$, or $500 \times 500$ um$^2$], geometric features in the active, poly, m1, and m2 layers of said integrated circuit exclusively from patterning having been determined by:
instantiating at least 100 abutting instances of a predefined base template at a minimum poly-to-poly pitch, wherein said base template defines patterning corresponding to the active, poly, contact, m1, m2 and via layers of said integrated circuit;
instantiating one or more regular connector templates within a majority of the instantiated base templates, each regular connector template selected from a set of fewer than 20 [or preferably 10, or more preferably 5] types of regular connector templates, wherein each type of regular connector template defines patterning corresponding to the active, poly, contact, m1, m2 or via layer of said integrated circuit, and wherein each type of regular connector template is eligible for instantiation at between one and 5 locations relative to a reference location in its associated base template; and,
instantiating one or more special connector templates within fewer than 10% [or preferably 5%, or more preferably 1%] of the instantiated base templates, each special connector template selected from a set of fewer than 4 [or preferably 3, or more preferably 2] types of special connector templates, wherein each type of special connector template defines patterning corresponding to the contact, m1, m2 or via layer of said integrated circuit, and wherein each type of special connector template is eligible for instantiation at a single location relative to a reference location in its associated base template.

What I claim as my invention is:

1. A logic circuit implemented in a region of an integrated circuit using a reduced pattern complexity design style, said logic circuit comprising:
uniform width, elongated, parallel positive and negative supply rails extending in a first direction in a first metal layer;
at least six identically shaped, elongated, unbroken, parallel, uniformly spaced and uniform width polysilicon stripes, each polysilicon stripe extending longitudinally in a second direction, perpendicular to the first direction, and spanning substantially the entire distance between opposing positive and negative supply rails;
only two elongated diffusion stripes, of different types, both located between said opposing positive and negative supply rails, a first of said diffusion stripes extending in the first direction in a first region proximate to the positive supply rail, and a second of said diffusion stripes extending in the first direction in a second region proximate the negative supply rail;

between each pair of adjacent polysilicon stripes, at least first and second elongated segments extending longitudinally in the second direction in the first metal layer, the first elongated segment located within the first region, and the second elongated segment located within the second region;

located in a third region between said first and second regions, a plurality of third elongated segments extending longitudinally in the second direction in the first metal layer, each of said third elongated segments overlying a respective one of said polysilicon stripes;

multiple connecting segments, including plural elongated connecting segments extending longitudinally in the first direction in the first metal layer and plural elongated connecting segments extending longitudinally in the first direction in a second metal layer;

wherein (i) the connecting segments provide connections that implement logic function(s); and (ii) a region bounded by the opposing supply rails and outermost polysilicon stripes is substantially fully populated with connecting segment(s) and/or dummy feature(s) in the first metal layer, but not substantially fully populated with connecting segment(s) and/or dummy feature(s) in the second metal layer.

2. The logic circuit of claim 1, wherein the implemented logic function(s) include at least one non-standard complex Boolean logic function of at least three inputs.

3. The logic circuit of claim 2, wherein a majority of transistors contained within the region bounded by the opposing supply rails and outermost polysilicon stripes are utilized to form the non-standard complex Boolean logic function(s) of at least three inputs.

4. The logic circuit of claim 1, wherein the number of identically shaped, elongated, unbroken, parallel, uniformly spaced and uniform width polysilicon stripes is at least 8.

5. The logic circuit of claim 1, wherein the number of identically shaped, elongated, unbroken, parallel, uniformly spaced and uniform width polysilicon stripes is at least 12.

6. A logic circuit implemented in a region of an integrated circuit using a reduced pattern complexity design style, said logic circuit comprising:

uniform width, elongated, parallel positive and negative supply rails extending in a first direction in a first metal layer;

at least six identically shaped, elongated, unbroken, parallel, uniformly spaced and uniform width polysilicon stripes, each polysilicon stripe extending longitudinally in a second direction, perpendicular to the first direction, and spanning substantially the entire distance between opposing positive and negative supply rails;

only two elongated diffusion stripes, of different types, both located between said opposing positive and negative supply rails, a first of said diffusion stripes extending in the first direction in a first region proximate to the positive supply rail, and a second of said diffusion stripes extending in the first direction in a second region proximate the negative supply rail;

between each pair of adjacent polysilicon stripes, at least first and second elongated segments extending longitudinally in the second direction in the first metal layer, the first elongated segment located within the first region, and the second elongated segment located within the second region;

multiple connecting segments, including plural elongated connecting segments extending longitudinally in the first direction in the second metal layer and plural elongated connecting segments extending longitudinally in the second direction in a second metal layer;

wherein (i) the connecting segments provide connections that implement logic function(s); and (ii) a region bounded by the opposing supply rails and outermost polysilicon stripes is substantially fully populated with connecting segment(s) and/or dummy feature(s) in the first metal layer, but not substantially fully populated with connecting segment(s) and/or dummy feature(s) in the second metal layer.

7. The logic circuit of claim 6, wherein the implemented logic function(s) include at least one non-standard complex Boolean logic function of at least three inputs.

8. The logic circuit of claim 7, wherein a majority of transistors contained within the region bounded by the opposing supply rails and outermost polysilicon stripes are utilized to form the non-standard complex Boolean logic function(s) of at least three inputs.

9. The logic circuit of claim 6, wherein the number of identically shaped, elongated, unbroken, parallel, uniformly spaced and uniform width polysilicon stripes is at least 8.

10. The logic circuit of claim 6, wherein the number of identically shaped, elongated, unbroken, parallel, uniformly spaced and uniform width polysilicon stripes is at least 12.

11. A logic circuit implemented in a region of an integrated circuit using a reduced pattern complexity design style, said logic circuit comprising:

a region of at least twenty semi-regular, identically bounded, abutting template instances, each template instance occupying a baseTemplate frame defined by:

(i) uniform width, elongated, parallel positive and negative supply rails extending in a first direction in a first metal layer that define a first set of opposing template boundaries; and (ii) adjacent, elongated, parallel, uniformly spaced and uniform width polysilicon stripes, each extending longitudinally in a second direction, perpendicular to the first direction, and spanning the entire distance between the opposing positive and negative supply rails, said adjacent polysilicon stripes defining a second set of opposing template boundaries;

said region of abutting template instances implementing multiple logic functions;

said region of abutting template instances further characterized by:

(a) a template regularity metric for the first metal layer of at least 0.50;

where the template regularity metric for a given layer is computed as the ratio of (1) the area of all features in the given layer that result from a logical ANDing of the shapes in each template instance in the given layer, and (2) the area of all features in the given layer that result from a logical ORing of the shapes in each template instance in the given layer.

12. The logic circuit of claim 11, wherein the template regularity metric for the first metal layer is at least 0.60.

13. The logic circuit of claim 12, wherein the template regularity metric for the first metal layer is at least 0.64.

14. The logic circuit of claim 12, wherein said region of abutting template instances is further characterized by:

(b) a template regularity metric for a second metal layer of at least 0.60.

15. The logic circuit of claim 11, wherein said region of abutting template instances is further characterized by:

(b) a template regularity metric for a second metal layer of at least 0.50.

16. The logic circuit of claim 11, wherein the implemented logic functions include at least one non-standard complex Boolean logic function of at least three inputs.

17. The logic circuit of claim 16, wherein a majority of transistors contained within the region of abutting template instances are utilized to form the non-standard complex Boolean logic function(s) of at least three inputs.

* * * * *